United States Patent [19]

Ishino et al.

[11] Patent Number: 5,373,296
[45] Date of Patent: Dec. 13, 1994

[54] ELECTROMAGNETIC WAVE ABSORBER AND WAVE ABSORPTION STRUCTURE

[75] Inventors: Ken Ishino; Yasuo Hashimoto; Toshifumi Saitoh; Ken Toyoda, all of Chiba, Japan

[73] Assignee: TDK Corporation, Tokyo, Japan

[21] Appl. No.: 101,620

[22] Filed: Aug. 3, 1993

[30] Foreign Application Priority Data

Aug. 18, 1992 [JP] Japan .................................. 4-240063
Mar. 22, 1993 [JP] Japan .................................. 5-085083

[51] Int. Cl.⁵ .............................................. H01Q 17/00
[52] U.S. Cl. ............................................ 342/4; 342/1
[58] Field of Search ........................................ 342/4, 1

[56] References Cited

U.S. PATENT DOCUMENTS

| 2,464,006 | 3/1949 | Tiley | 342/4 |
| 4,023,174 | 5/1977 | Wright | 342/4 |
| 5,113,190 | 5/1992 | Klein | 342/4 |

FOREIGN PATENT DOCUMENTS

| 685044 | 2/1967 | Belgium . | |
| 370421 | 5/1990 | European Pat. Off. . | |
| 1268232 | 5/1968 | Germany | 342/4 |
| 3-39898 | 4/1991 | Japan . | |
| 4-44300 | 2/1992 | Japan . | |
| 91/20179 | 6/1990 | WIPO . | |

OTHER PUBLICATIONS

"Numerical analysis of Plane-Wave Reflection from Double Periodic Absorber Structures", B. L. Michielsen, L. Leyton, R. W. C. van der Veeken (Philips Research Laboratories (pp. 551–556).

"Improved Low-Frequency Performance of Pyramid-Cone Absorbers . . . " Edward F. Kuester and Christopher L. Holloway (Electromagnetics Lab, Dept. of Electrical & Computer Engineering–University of Colorado, Session 6C (pp. 394–399).

*Primary Examiner*—Gilberto Barrón, Jr.
*Attorney, Agent, or Firm*—Collard & Roe

[57] ABSTRACT

An electromagnetic wave absorber has a pair of electromagnetic wave absorbing plates (10,11) made of ohmic resistance loss material with top portions (10a,11a) and bottom portions (10b,11b), and a common bottom support member (12) for supporting the bottom portions (10b,11b) of the plates (10,11). In assembled state, the top portions (10a,11a) of the plates (10,11) are fixed with each other and the bottom portions (10b,11b) of the plates (10,11) are fixed by the bottom support member (12) so that the plates (10,11) form an wedge shape.

25 Claims, 22 Drawing Sheets

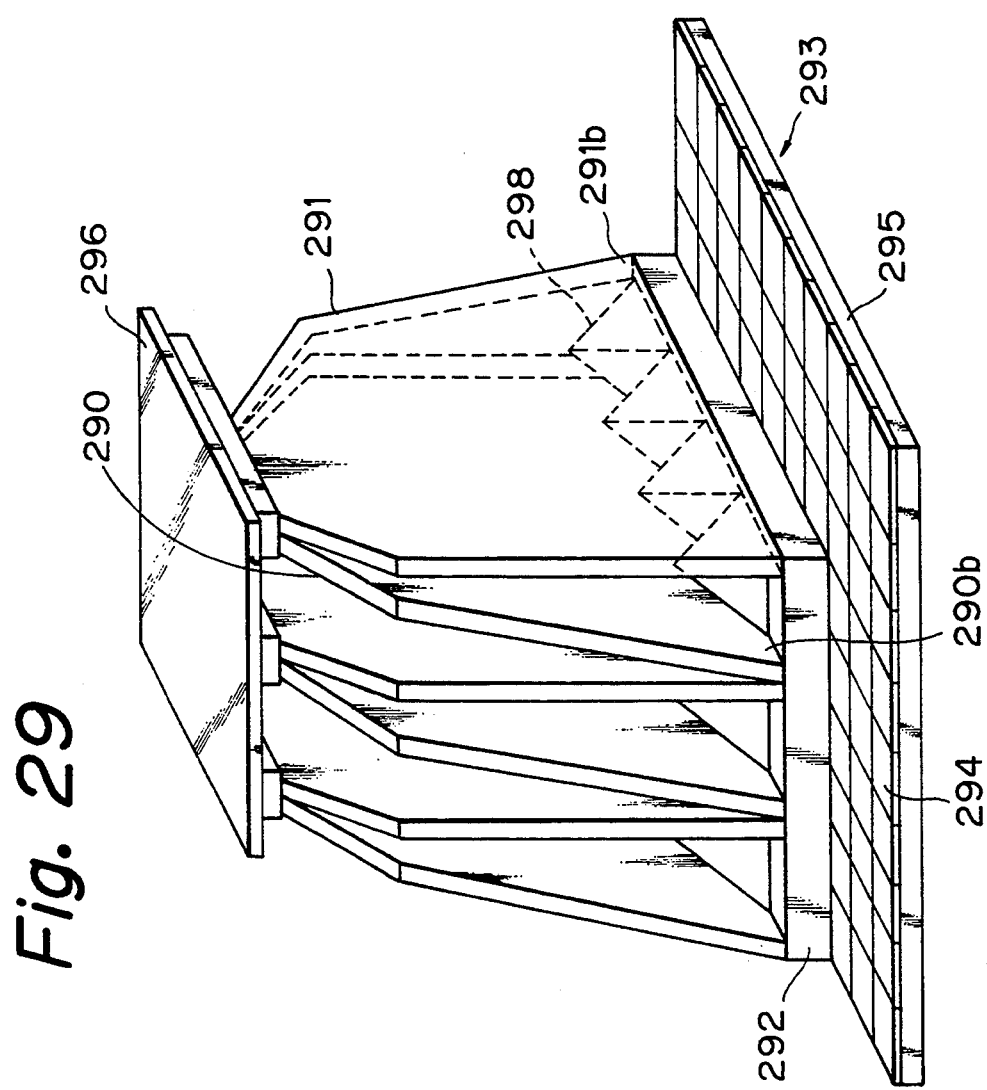

ELECTROMAGNETIC WAVE ABSORBER AND WAVE ABSORPTION STRUCTURE

BACKGROUND OF THE INVENTION

1. Field of the Invention

The present invention relates to an electromagnetic wave absorber used mostly to cover inner surfaces of an anechoic chamber and to an electromagnetic wave absorption structure.

2. Description of the Related Art

Inner surfaces of such the anechoic enclosure, namely ceiling, side walls and sometimes floor of the anechoic chamber utilized for measuring radio characteristics of an electronic equipment disposed therein will be covered by arrays of electromagnetic wave absorbers. These absorbers are in general made from solid ohmic loss material in the form of wedges or pyramids. Tapered shape (wedge or pyramid) of the absorbers is advantageous for attenuating reflections of waves because the input impedance of the absorbers against the incidence waves will gradually change.

However, the weight of the absorbers of such the solid type becomes very heavy because one meter or more height is required for obtaining sufficient energy absorption. The heavier of the absorbers, the more difficult of transportation and installation of the absorbers. Also, if the absorbers are very heavy, it may be fallen from the walls after installation and the transportation cost will greatly increase. Furthermore, the material cost of the solid type absorbers is extremely high.

In order to reduce the weight of the absorber, a monoblock absorber having hollow pyramid shape has been proposed (Japanese Patent Unexamined Publication No. 4(1992)-44300 and Japanese Utility Model Unexamined Publication No. 3(1991)39898). However, this absorber is not only very difficult for producing but also easily damaged during the transportation because of its poor strength. Furthermore, since each of the absorbers is of great bulk and cannot be disjointed during transportation and installation, the transportation cost is extremely high and the installation of the absorber to the wall is very difficult.

SUMMARY OF THE INVENTION

It is therefore an object of the present invention to provide an electromagnetic wave absorber and an electromagnetic wave absorption structure having light weight so as to be easily produced and to decrease the transportation cost.

Another object of the present invention is to provide an electromagnetic wave absorber and an electromagnetic wave absorption structure which can be disjointed during transportation and can be easily attached to inner walls of an anechoic chamber.

Further object of the present invention is to provide an electromagnetic wave absorber and an electromagnetic wave absorption structure which can excellently absorb electromagnetic energy for a wide frequency range unless the impedance thereof is mismatched with the impedance of a ferrite board disposed behind the absorber to constitute a wave absorbing wall.

According to the present invention, an electromagnetic wave absorber has a pair of electromagnetic wave absorbing plates made of ohmic resistance loss material with top portions and bottom portions, and a common bottom support member for supporting the bottom portions of the plates. In assembled state, the top portions of the plates are fixed with each other and the bottom portions of the plates are fixed by the bottom support member so that the plates form an wedge shape.

Since the wave absorbing plates and also the bottom support member can be separated from each other before assembling, the absorbers can be transported in the disjointed state. Therefore, the absorbers can be easily protected from being damaged during transportation. Also since the bulk of the absorbers can be very small during transportation, the transportation cost will be extremely reduced. Furthermore, since the absorber is constituted not by four walls but by two plates, the total weight of the absorption structure will become very light resulting that the transportation and the installation of the absorbers to the anechoic chamber wall can be easily performed without applying excess load to the wall.

Each of the plates is preferably constituted by a plate having a nearly rectangular shape or a plate having a lateral width being narrower toward its top.

Preferably, the absorber includes a top support member for supporting the top portions of the plates.

Both the top support member and the bottom support member may be made of wave passing material which substantially passes electromagnetic wave without absorbing, or made of ohmic resistance loss material.

In an embodiment, the top support member may be made of wave passing material which substantially passes electromagnetic wave without absorbing and the bottom support member may be made of ohmic resistance loss material.

In another embodiment, the top support member may be made of both wave passing material which substantially passes electromagnetic wave without absorbing and ohmic resistance loss material.

It is preferred that the absorber includes at least one electromagnetic wave absorbing inner member made of ohmic resistance loss material, which inner member is mounted on the bottom support member between the plates.

According to this constitution, wave reflections at the high frequency range can be effectively suppressed by the wave absorbing inner member so as to improve frequency characteristics in the high frequency range. In case the bottom support member and the inner member are formed in integral made of foamed material containing carbon, graphite, or mixture of carbon and graphite, the graphite (carbon or mixture of carbon and graphite) content in the foamed material should be adequately adjusted so that the wave attenuation efficiency of the ferrite wall member will never be lowered.

The inner member may be constituted by at least one electromagnetic wave absorbing inner plate to be directed perpendicular to the wave absorbing plates, or constituted by at least one inner member having a sharp tip to be directed to the top of the absorber.

The inner member may be constituted by a block having a triangular prism shape, by a block having a pyramid shape, by a plurality of blocks having pyramid shapes arranged in one or two arrays, by a plurality of blocks having circular cone shapes arranged in an array, or by a block having a smoothly saw-toothed top.

It is preferred that the top support member is constituted by a support member for coupling the top portions of a plurality of pairs of the plates.

It is also preferred that the bottom support member has a plurality of grooves for receiving the bottom portions of the plates.

Preferably, each of the plates has at least one leg, and the bottom support member has a plurality of rectangular holes for receiving the legs of the plates, respectively.

The rectangular holes may be zigzag arranged to receive the legs formed on each of the plates in asymmetrical arrangement.

It is preferred that one of a pair of the plates has at least one projection and the other of a pair of the plates has at least one recess for receiving the projection.

According to the present invention, an electromagnetic wave absorption structure includes a plurality of electromagnetic wave absorbers each of which includes a pair of electromagnetic wave absorbing plates made of ohmic resistance loss material with top portions and bottom portions, and a common bottom support member for supporting the bottom portions of the plates, whereby, in assembled state, the top portions of the plates are fixed with each other and the bottom portions of the plates are fixed by the bottom support member so that the plates form an wedge shape; and a ferrite wall member for covering walls of an anechoic chamber. The absorber is to be attached to the front surface of the ferrite wall member.

It is preferred that the absorbers are arranged on the ferrite wall member so that the two adjacent absorbers are orthogonally directed with each other, or arranged on the ferrite wall member so that one unit of the three absorbers is perpendicular to another unit of the three absorbers.

Further objects and advantages of the present invention will be apparent from the following description of the preferred embodiments of the invention as illustrated in the accompanying drawings.

BRIEF DESCRIPTION OF THE DRAWINGS

FIG. 29 shows a perspective view of an electromagnetic wave absorption structure as a twenty-fourth embodiment according to the present invention.

DESCRIPTION OF THE PREFERRED EMBODIMENTS

Figure 1:
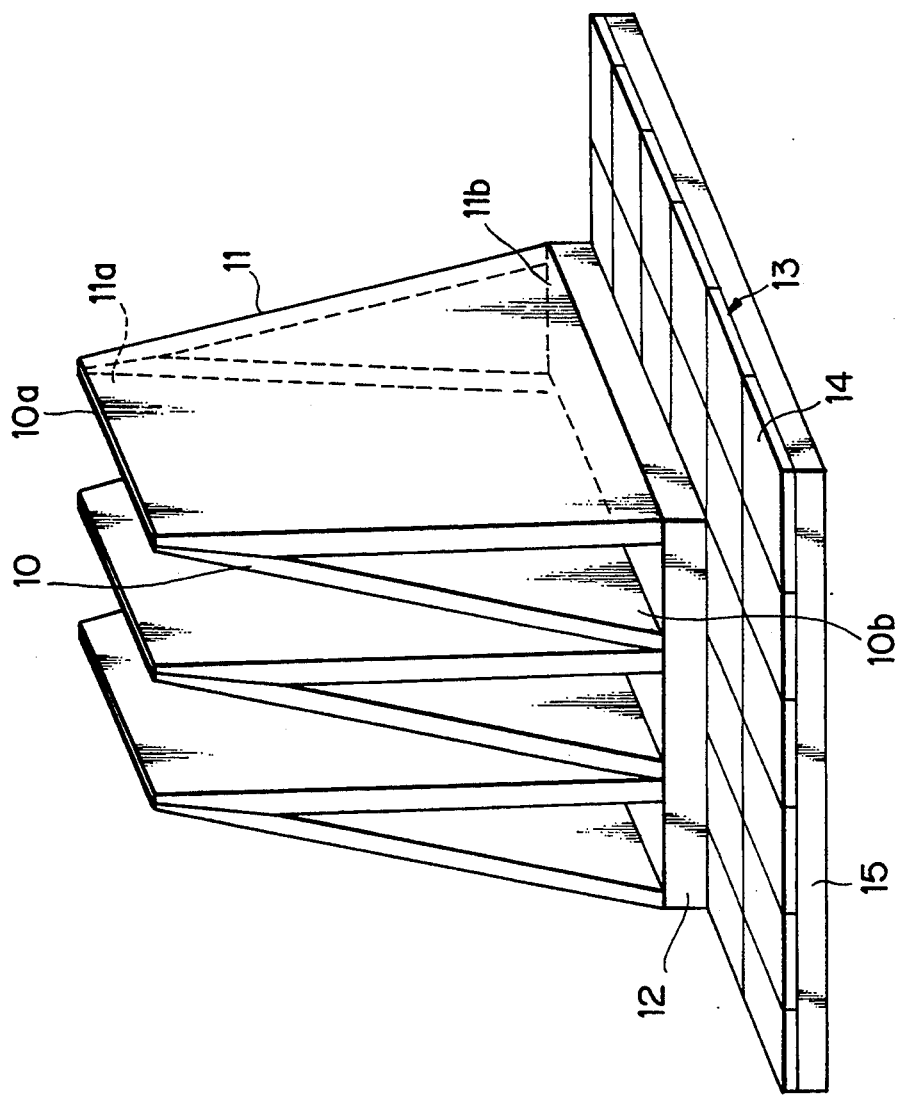
FIG. 1 shows a perspective view of an electromagnetic wave absorption structure as a preferred first embodiment according to the present invention.

Referring to FIG. 1 which shows a part of an installed (assembled) electromagnetic wave absorption structure as a first embodiment according to the present invention, reference numerals 10 and 11 denote a pair of electromagnetic wave absorbing plates made of ohmic resistance loss material such as foamed (plastic) material containing carbon, graphite, or mixture of carbon and graphite. Each of these absorbing plates 10 and 11 is formed in nearly rectangular shape having a size with lateral length (base length) of about 600 mm, longitudinal length (height) of about 1000 mm and thickness of about 30 mm. The thickness of the top portions 10a and 11a of the respective plates 10 and 11 are made less than that of the other portions.

In installed condition, a pair of the absorbing plates 10 and 11 are assembled to form an wedge (V-shaped section) making a predetermined angle. Namely, the top portions 10a and 11a of the plates 10 and 11 are abutted and fixed with each other by an adhesive agent for example, and bottom portions 10b and 11b of the respective plates 10 and 11 are fixed, by an adhesive agent for example, to a bottom support member 12 made of the same foamed material containing carbon, graphite, or mixture of carbon and graphite.

Each of electromagnetic wave absorbers is basically formed by these plates 10 and 11 and the bottom support member 12. These absorbers are arrayed on and fixed to, by an adhesive agent for example, ferrite wall member 13 which is constituted by a number of ferrite tiles 14, having the thickness of about 5 mm, stuck to all over the surface of a wall board 15 of an anechoic chamber.

In assembling the absorption structure, at first the ferrite tiles 14 are attached to the wall board 15 to form the ferrite wall member 13, then the bottom support member 12 is fixed on the ferrite member 13, and thereafter pairs of the absorbing plates 10 and 11 are attached on the support member 12 to make the wedged shape absorbers.

According to the above-mentioned first embodiment, since the wave absorbing plates 10 and 11 and also the bottom support member 12 can be separated from each other before assembling, the absorbers can be transported in the disjointed state. Therefore, the absorbers can be easily protected from being damaged during transportation. Also since the bulk of the absorbers can be very small during transportation, the transportation cost will be extremely reduced. Furthermore, according to the first embodiment, since the absorber is constituted not by four walls but by two walls 10 and 11, the total weight of the absorption structure is very light resulting that the transportation and the installation of the absorbers to the anechoic chamber wall can be easily performed without applying excess load to the wall.

Figure 2:
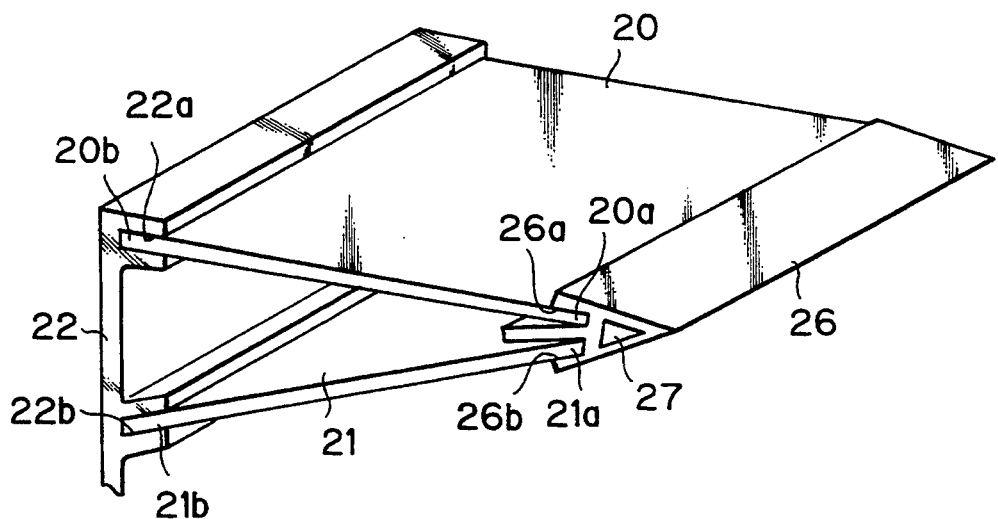
FIG. 2 shows a perspective view of an electromagnetic wave absorber as a second embodiment according to the present invention.

FIG. 2 shows a part of a assembled electromagnetic wave absorber as a second embodiment according to the present invention. In the figure, reference numerals 20 and 21 denote a pair of electromagnetic wave absorbing plates made of ohmic resistance loss material such as foamed (plastic) material containing carbon, graphite, or mixture of carbon and graphite. Each of these absorbing plates 20 and 21 is formed in nearly rectangular shape having a size with lateral length (base length) of about 600 mm, longitudinal length (height) of about 1000 mm and thickness of about 27 mm.

In installed state, a pair of the absorbing plates 20 and 21 are assembled with a top support member 26 and a bottom support member 22 to form an wedge (V-shaped section) making a predetermined angle. Namely, top portions 20a and 21a of the plates 20 and 21 are inserted into and fixed to grooves 26a and 26b of the top support member 26, respectively, and also bottom portions 20b and 21b of the respective plates 20 and 21 are inserted into and fixed to grooves 22a and 22b of the bottom support member 22, respectively.

The top support member 26 is made of white foamed material which substantially passes electromagnetic wave without absorbing. The member 26 has a hollow portion 27 filled with ohmic loss material such as foamed material containing carbon, graphite, or mixture of carbon and graphite, in front of the grooves 26a and 26b. In modified cases, whole the top support member 26 may be constituted by another wave passing material or by wave absorbing material.

The bottom support member 22 is also made of white foamed material which substantially passes electromagnetic wave without absorbing. The bottom face of the member 22 has the longitudinal length of about 600 mm and lateral length of about 200 mm. In modified cases, the bottom support member 22 may be constituted by another wave passing material or by wave absorbing material.

The distance and the angle between the grooves 22a and 22b of the bottom support member 22 and also the distance and the angle between the grooves 26a and 26b of the top support member 26 are determined so that the absorbing plates 20 and 21 inserted thereto form an wedge (V-shaped section) making a predetermined angle.

Since the wave absorbing plates 20 and 21 and also the top support member 26 and the bottom support member 22 can be separated from each other before assembling, the absorbers can be transported in the disjointed state. Therefore, the absorbers can be easily protected from being damaged during transportation. Also since the bulk of the absorbers can be very small during transportation, the transportation cost will be extremely reduced. Furthermore, according to the second embodiment, since the absorber is constituted not by four walls but by only two walls 20 and 21, the total weight of the absorption structure becomes very light. This results that the transportation and the installation of the absorbers to the anechoic chamber wall can be easily performed without applying excess load to the wall. Since the members 22 and 26 are constituted by white material, the walls of the anechoic chamber will be more lightened.

Figure 3:
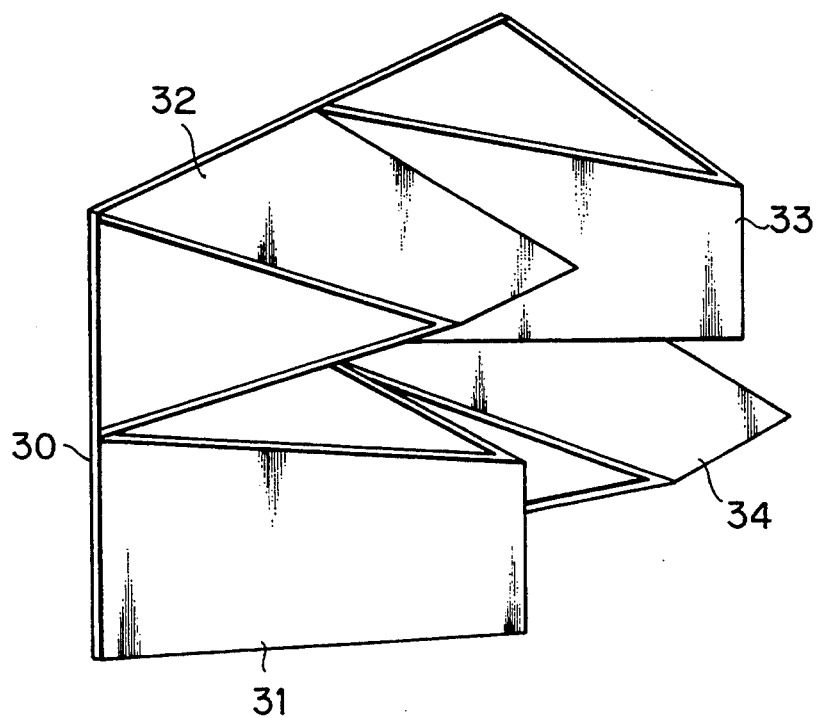
FIG. 3 shows a perspective view of an example of an electromagnetic wave absorption structure to which the absorbers shown in FIG. 2 are arrayed.

As shown in FIG. 3, these absorbers are generally arrayed on and fixed to, by an adhesive agent for example, ferrite wall member 30 having the thickness of about 5 mm in order to improve the wave absorbing characteristics.

In assembling the absorption structure, at first the ferrite wall member 30 is attached to a wall board of an anechoic chamber, then the bottom support member 22 is fixed on the ferrite member 30. Then, pairs of the absorbing plates 20 and 21 are attached to the support member 22 by engaging the bottom portions 20b and 21b with the grooves 22a and 22b, respectively, and thereafter the top supporting member 26 is attached to the plates by engaging the top portions 20a and 21a with the grooves 26a and 26b, respectively. Thus, as each of the separated parts having small bulk is successively assembled to make the wedged shape absorbers, installation operation of the absorption structure becomes very easy.

The absorbers on a ferrite wall member 30 may be arranged, as shown in FIG. 3, so that two adjacent absorbers 31 and 32, 32 and 33, 33 and 34, and 34 and 31 are orthogonally directed with each other, respectively. This arrangement is advantageous for reducing the difference of the absorbing performance caused by polarization direction of the applied wave.

Figure 4:
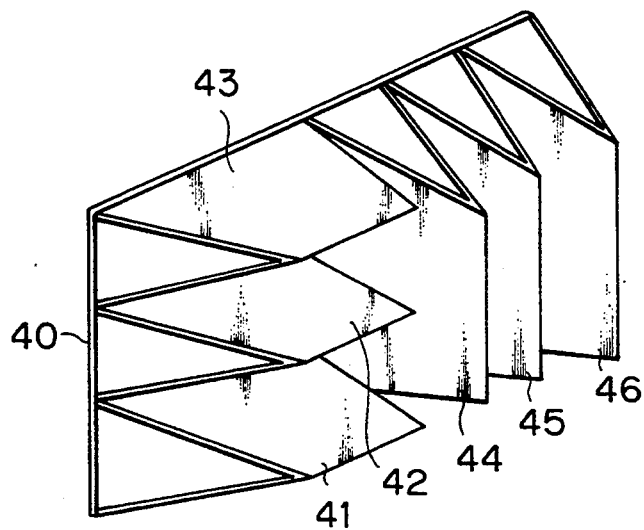
FIG. 4 shows a perspective view of another example of an electromagnetic wave absorption structure to which the absorbers shown in FIG. 2 are arrayed.

The arrangement of the absorbers on a fertile wall member 40 can be modified as shown in FIG. 4 in which one unit of three absorbers 41, 42 and 43 is perpendicular to another unit of three absorbers 44, 45 and 46.

Figure 5:
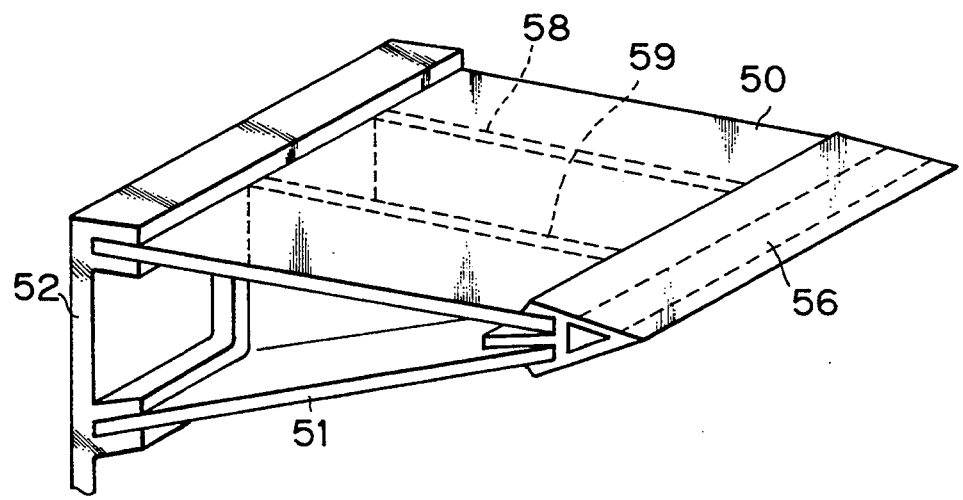
FIG. 5 shows a perspective view of an electromagnetic wave absorber as a third embodiment according to the present invention.

FIG. 5 shows a part of a assembled electromagnetic wave absorber as a third embodiment according to the present invention. Constitution and function of electromagnetic wave absorbing plates 50 and 51, a top support member 56 and a bottom support member 52 of this embodiment are substantially the same as those of the electromagnetic wave absorbing plates 20 and 21, the top support member 26 and the bottom support member 22 of the second embodiment, respectively.

In this embodiment, two electromagnetic wave absorbing inner plates 58 and 59 having a thickness of about 27 mm are additionally mounted between the plates 50 and 51 so that the surfaces of the inner plates 58 and 59 are perpendicular to the surfaces of the plates 50 and 51. The inner plates 58 and 59, which are advantageous for reducing the difference of the absorbing performance caused by polarization direction of the applied wave, are made of ohmic resistance loss material such as foamed (plastic) material containing carbon, graphite, or mixture of carbon and graphite. Although two of inner plates are provided in this embodiment, the number of the inner plates and also the space between them can be optionally modified.

Figure 6:
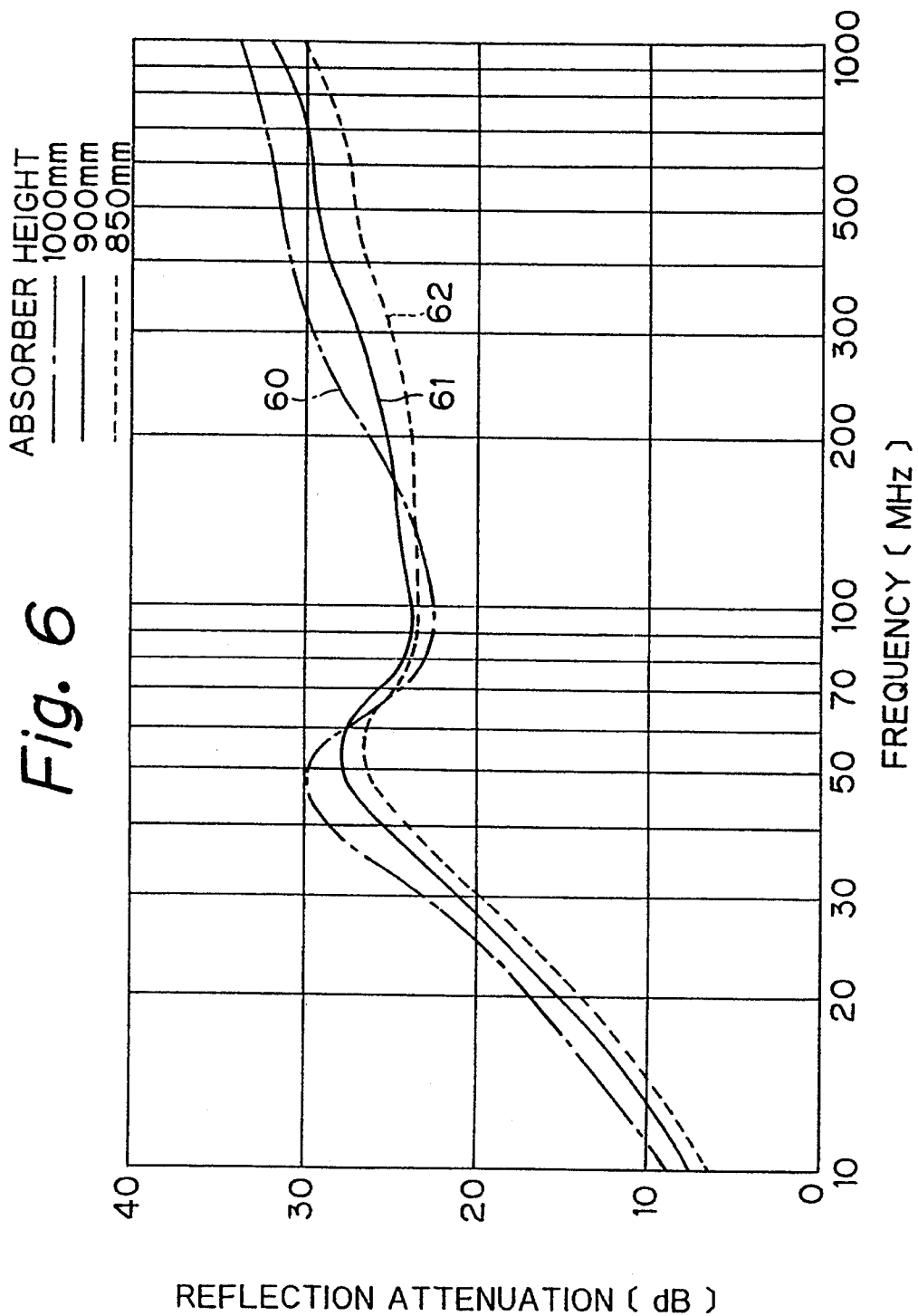
FIG. 6 shows a graph of reflection attenuation vs frequency characteristics of the third embodiment.

FIG. 6 shows wave absorbing characteristics (reflection attenuation vs frequency characteristics) of an wave absorption structure in which the absorbers according to the above-mentioned third embodiment are attached in front of a ferrite board having a thickness of about 5 mm. In this figure, reference numeral 60 denotes the characteristics in which the height of the wave absorbing plate 50 (51) is 1000 mm, 61 denotes that in which the height is 900 mm, and 62 denotes that in which the height is 850 mm. As will be apparent from FIG. 6, the minimum height of the wave absorbing plate will be 900 mm in order to obtain good absorbing characteristics of 20 to 25 dB within the range from 30 to 1000 MHz.

Figure 7:
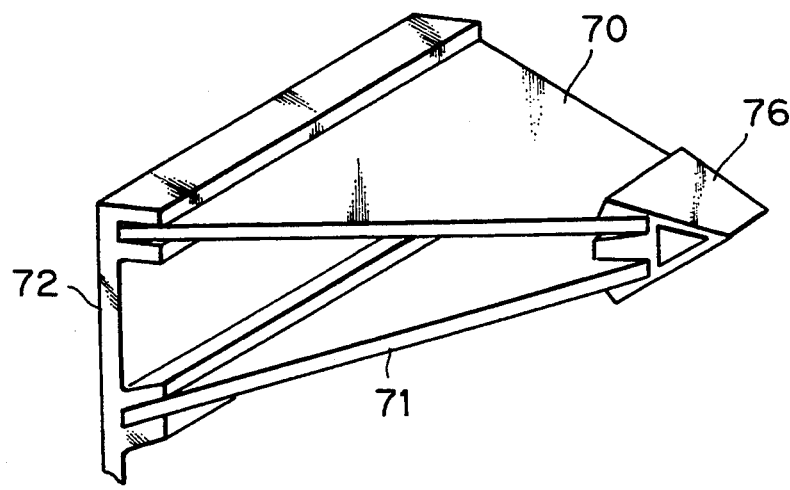
FIG. 7 shows a perspective view of an electromagnetic wave absorber as a fourth embodiment according to the present invention.

FIG. 7 shows a part of a assembled electromagnetic wave absorber as a fourth embodiment according to the present invention. In this embodiment, each of electromagnetic wave absorbing plates 70 and 71 is formed in a trapezoid shape and thus the length of a top support member 76 is shortened in comparison with that of the top support member 26 in the second embodiment. This results that the weight of the absorbing plates 70 and 71 and of the member 76 can be more decreased causing the transportation and the installation of the absorbers to the anechoic chamber to become easier. Constitution and function of a bottom support member 72 and another portion of this embodiment are substantially the same as those of the second embodiment.

Figure 8:
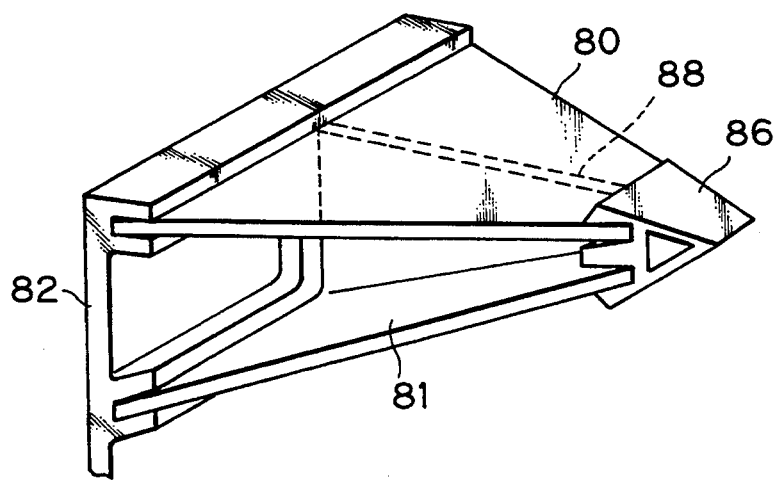
FIG. 8 shows a perspective view of an electromagnetic wave absorber as a fifth embodiment according to the present invention.

FIG. 8 shows a part of a assembled electromagnetic wave absorber as a fifth embodiment according to the present invention. In this embodiment, as similar to the fourth embodiment of FIG. 7, each of electromagnetic wave absorbing plates 80 and 81 is formed in a trapezoid shape and thus the length of a top support member 86 is shortened in comparison with that of the top support member 56 in the third embodiment. This results that the weight of the absorbing plates 80 and 81 and of the member 86 can be more decreased causing the transportation and the installation of the absorbers to the anechoic chamber to become easier as aforementioned. Constitution and function of a bottom support member 82 and an electromagnetic wave absorbing inner plate 88 of this embodiment are substantially the same as those of the third embodiment shown in FIG. 5 except that only one inner plate 88 is provided in this embodiment.

Figure 9:
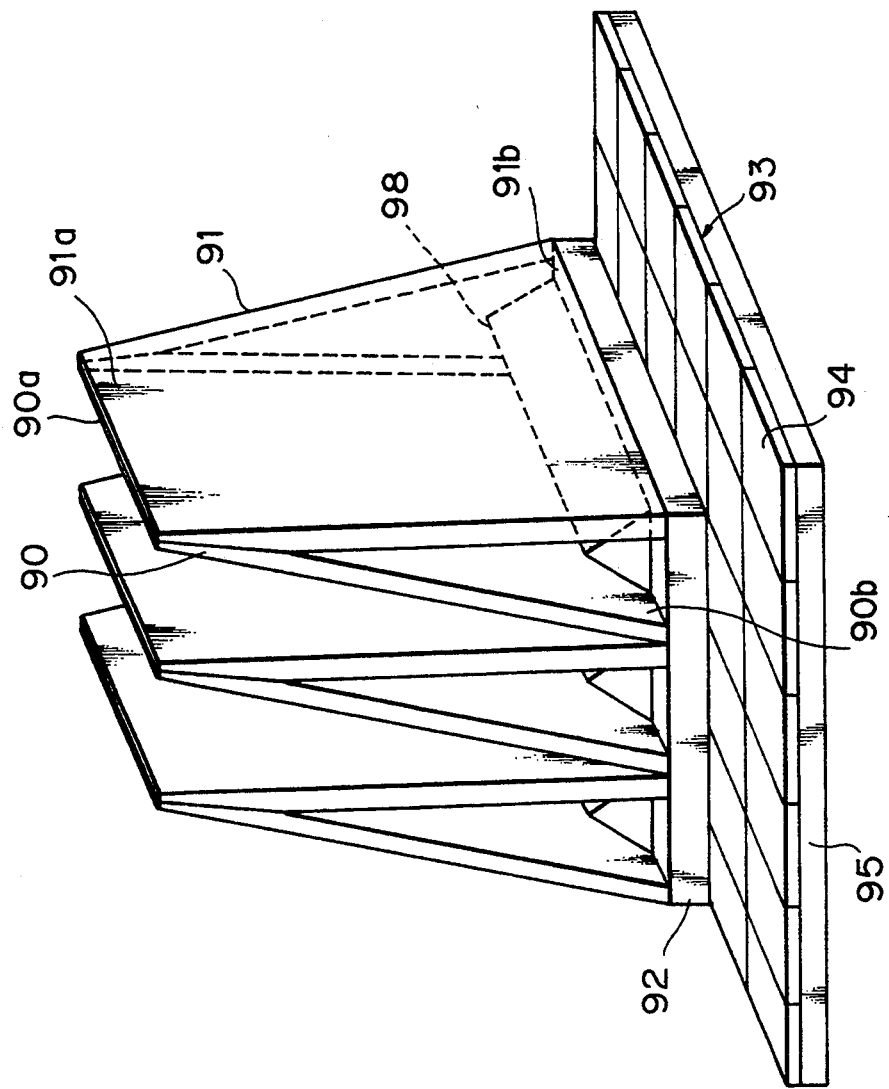
FIG. 9 shows a perspective view of an electromagnetic wave absorption structure as a sixth embodiment according to the present invention.
Figure 10:
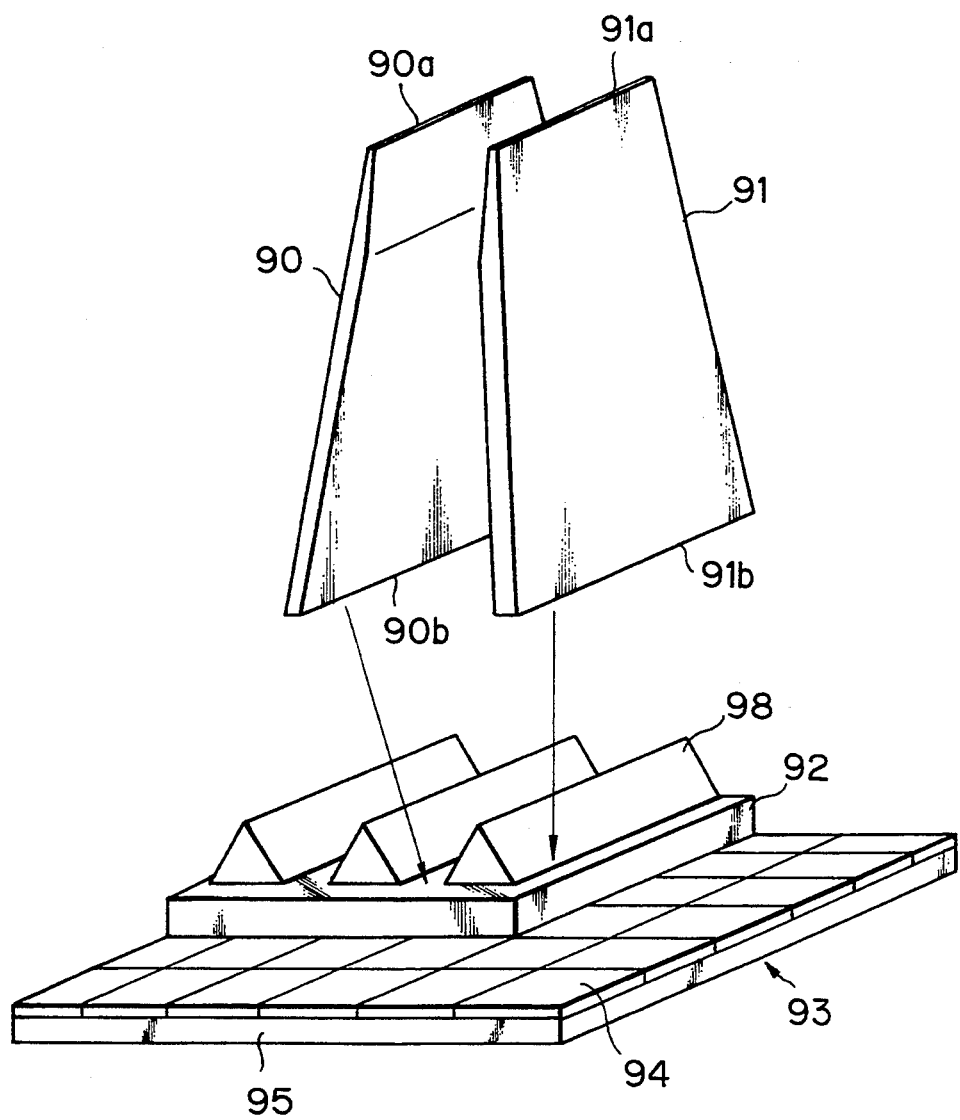
FIG. 10 shows an exploded perspective view of the sixth embodiment shown in FIG. 9.

FIGS. 9 and 10 show a part of an assembled electromagnetic wave absorption structure as a sixth embodiment according to the present invention. In these figures, reference numerals 90 and 91 denote a pair of electromagnetic wave absorbing plates made of ohmic resistance loss material such as foamed (plastic) material containing carbon, graphite, or mixture of carbon and graphite. Each of these absorbing plates 90 and 91 is formed in nearly rectangular shape having a size with lateral length (base length) of about 600 mm, longitudinal length (height) of about 1000 mm and thickness of about 30 mm. The thickness of the top portions 90a and 91a of the respective plates 90 and 91 are made less than that of the other portions.

In installed condition, a pair of the absorbing plates 90 and 91 are assembled to form an wedge (V-shaped section) making a predetermined angle. Namely, the top portions 90a and 91a of the plates 90 and 91 are abutted and fixed with each other by an adhesive agent for example, and bottom portions 90b and 91b of the respective plates 90 and 91 are fixed, by an adhesive agent for example, to a bottom support member 92 made of the same foamed material containing carbon, graphite, or mixture of carbon and graphite. An electromagnetic wave absorbing inner member 98 having a nearly triangular prism shape is formed on the bottom support member 92 between the bottom portions 90b and 91b of the plates so that an edge of the prism directs to the top of the absorber. The inner member 98 is made of ohmic resistance loss material such as foamed (plastic) material containing carbon, graphite, or mixture of carbon and graphite as a separate component from or an integral component with the bottom support member 92.

Each of electromagnetic wave absorbers is basically formed by these plates 90 and 91, the inner member 98 and the bottom support member 92. These absorbers are arrayed on and fixed to, by an adhesive agent for example, ferrite wall member 93 which is constituted by a number of ferrite tiles 94, having the thickness of about 5 mm, stuck to all over the surface of a wall board 95 of an anechoic chamber.

In assembling the absorption structure, at first the ferrite tiles 94 are attached to the wall board 95 to form the ferrite wall member 93, then the bottom support member 92 provided with the wave absorbing inner member 98 is fixed on the ferrite member 93, and thereafter pairs of the absorbing plates 90 and 91 are attached on the support member 92 to make the wedged shape absorbers.

According to the above-mentioned sixth embodiment wave reflections at the high frequency range can be effectively suppressed by the wave absorbing inner member 98 so as to improve frequency characteristics in the high frequency range. In case the bottom support member 92 and the inner member 98 are formed in integral by foamed (plastic) material containing carbon, graphite, or mixture of carbon and graphite, the graphite (carbon or mixture of carbon and graphite) content in the foamed material should be adequately adjusted so that the wave attenuation efficiency of the ferrite wall member 93 will never be lowered. Furthermore, since the wave absorbing plates 90 and 91 and also the bottom support member 92 with the wave absorbing inner member 98 can be separated from each other before assembling, the absorbers can be transported in the disjointed state. Therefore, the absorbers can be easily protected from being damaged during transportation. Also since the bulk of the absorbers can be very small during transportation, the transportation cost will be extremely reduced. Furthermore, according to this embodiment, since the absorber is constituted not by four walls but by two walls 90 and 91, the total weight of the absorption structure is very light resulting that the transportation and the installation of the absorbers to the anechoic chamber wall can be easily performed without applying excess load to the wall.

The absorbers on a ferrite wall member 93 may be arranged, as the same as shown in FIG. 3, so that two adjacent absorbers are orthogonally directed with each other, respectively. This arrangement is advantageous for reducing the difference of the absorbing performance caused by polarization direction of the applied wave. The arrangement of the absorbers on a ferrite wall member 93 can be modified as the same as shown in FIG. 4 in which one unit of three absorbers is perpendicular to another unit of three absorbers.

It should be noted that, in a modified case, all the absorbers arranged in the wave absorption structure may not have the wave absorbing inner members, respectively.

Figure 11:
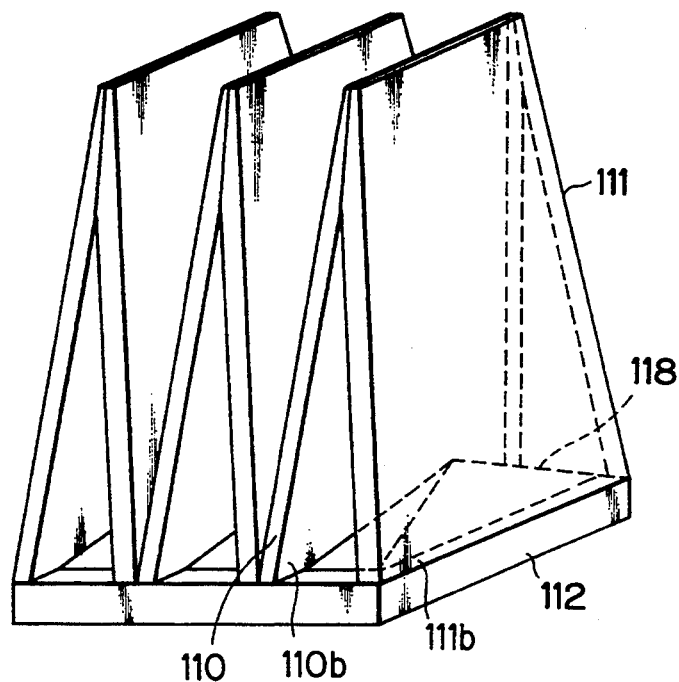
FIG. 11 shows a perspective view of electromagnetic wave absorbers as a seventh embodiment according to the present invention.

FIG. 11 shows a part of assembled electromagnetic wave absorbers as a seventh embodiment according to the present invention. In this embodiment, a single electromagnetic wave absorbing inner member 118 having a nearly pyramid shape is formed on a bottom support member 112 between bottom portions 110b and 111b of two electromagnetic wave absorbing plates 110 and 111 so that the top of the pyramid directs to the top of the absorber. The inner member 118 is made of ohmic resistance loss material such as foamed (plastic) material containing carbon, graphite, or mixture of carbon and graphite as a separate component from or an integral component with the bottom support member 112. Constitution and function of the absorbers of this embodiment are substantially the same as those of the sixth embodiment shown in FIGS. 9 and 10 except for the above-mentioned shape of the wave absorbing inner member 118.

Figure 12:
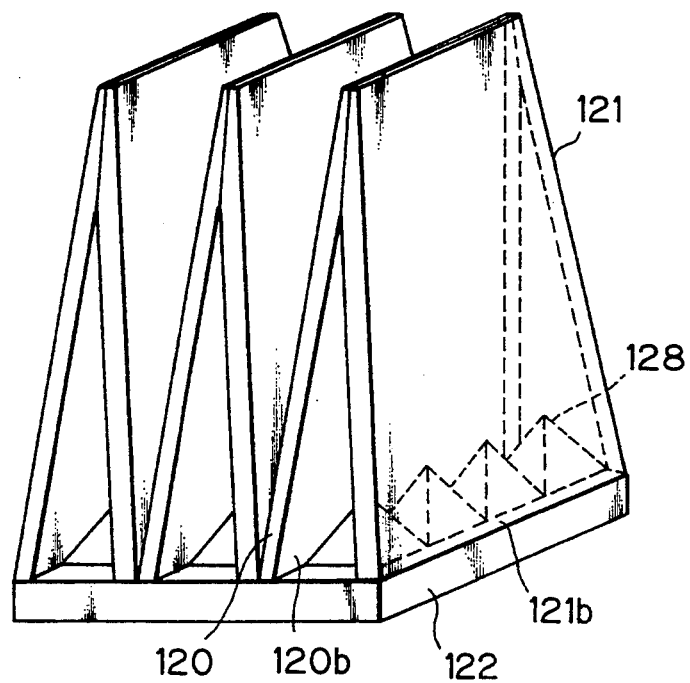
FIG. 12 shows a perspective view of electromagnetic wave absorbers as an eighth embodiment according to the present invention.

FIG. 12 shows a part of assembled electromagnetic wave absorbers as an eighth embodiment according to the present invention. In this embodiment, a plurality of electromagnetic wave absorbing inner members 128 each of which has a nearly pyramid shape are formed in an array on a bottom support member 122 between bottom portions 120b and 121b of two electromagnetic wave absorbing plates 120 and 121 so that the top of the pyramids direct to the top of the absorber. The inner members 128 are made of ohmic resistance loss material such as foamed (plastic) material containing carbon, graphite, or mixture of carbon and graphite as separate components from or an integral component with the bottom support member 122. Constitution and function of the absorbers of this embodiment are substantially the same as those of the sixth embodiment shown in FIGS. 9 and 10 except for the above-mentioned shape and the number of the wave absorbing inner members 128.

Figure 13:
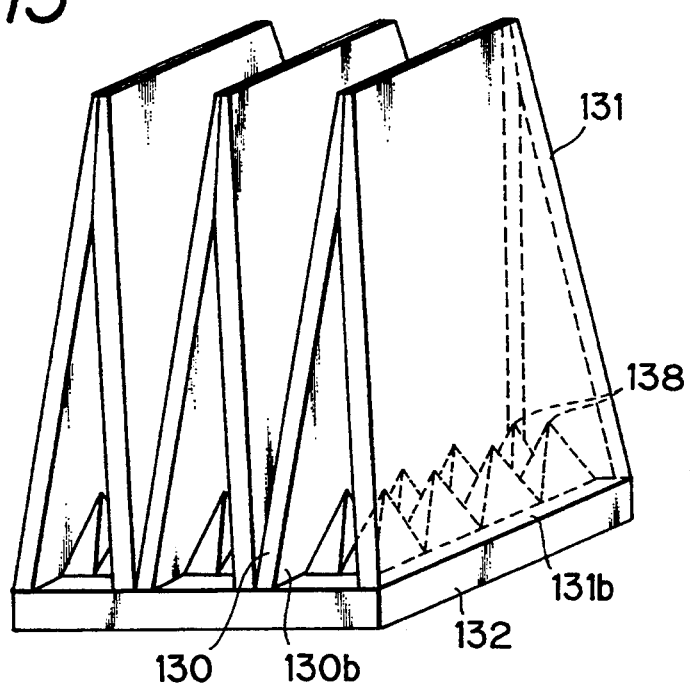
FIG. 13 shows a perspective view of electromagnetic wave absorbers as a ninth embodiment according to the present invention.

FIG. 13 shows a part of assembled electromagnetic wave absorbers as a ninth embodiment according to the present invention. In this embodiment, a plurality of electromagnetic wave absorbing inner members 138 each of which has a nearly pyramid shape are formed in two arrays on a bottom support member 132 between bottom portions 130b and 131b of two electromagnetic wave absorbing plates 130 and 131 so that the top of the pyramids direct to the top of the absorber. The inner members 138 are made of ohmic resistance loss material such as foamed (plastic) material containing carbon, graphite, or mixture of carbon and graphite as separate components from or an integral component with the bottom support member 132. Constitution and function of the absorbers of this embodiment are substantially the same as those of the sixth embodiment shown in FIGS. 9 and 10 except for the above-mentioned shape and the number of the wave absorbing inner members 138.

Figure 14:
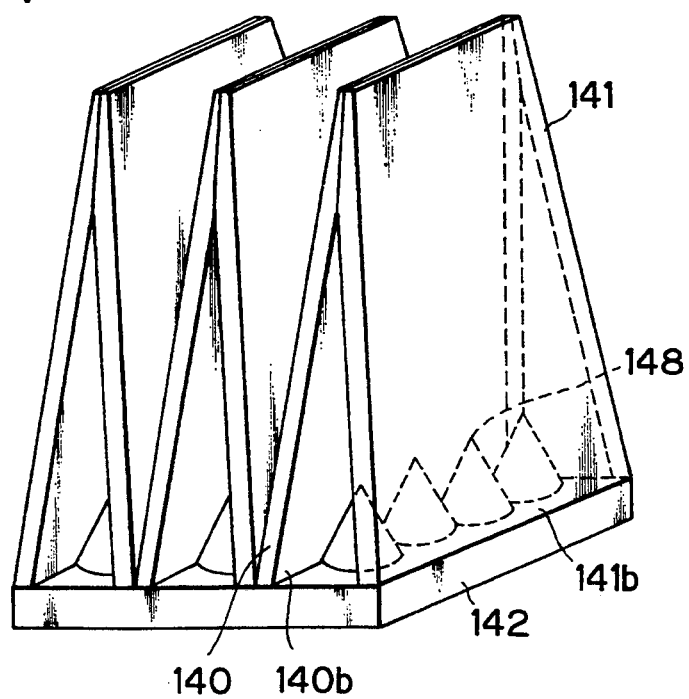
FIG. 14 shows a perspective view of electromagnetic wave absorbers as a tenth embodiment according to the present invention.

FIG. 14 shows a part of assembled electromagnetic wave absorbers as a tenth embodiment according to the present invention. In this embodiment, a plurality of electromagnetic wave absorbing inner members 148 each of which has a nearly circular cone shape are formed in an array on a bottom support member 142 between bottom portions 140b and 141b of two electromagnetic wave absorbing plates 140 and 141 so that the top of the cones direct to the top of the absorber. The inner members 148 are made of ohmic resistance loss material such as foamed (plastic) material containing carbon, graphite, or mixture of carbon and graphite as separate components from or an integral component with the bottom support member 142. Constitution and function of the absorbers of this embodiment: are substantially the same as those of the sixth embodiment shown in FIGS. 9 and 10 except for the above-mentioned shape and the number of the wave absorbing inner members 148.

Figure 15:
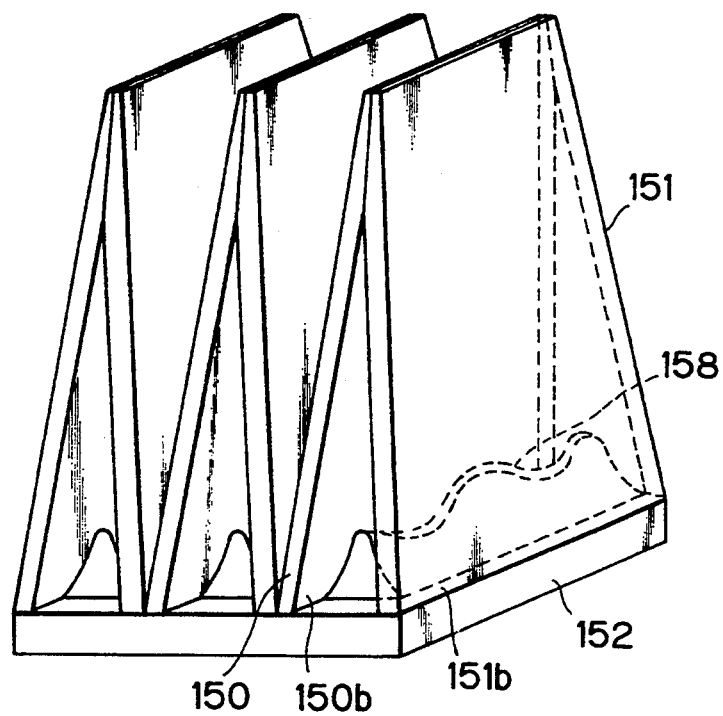
FIG. 15 shows a perspective view of electromagnetic wave absorbers as an eleventh embodiment according to the present invention.

FIG. 15 shows a part of assembled electromagnetic wave absorbers as an eleventh embodiment according to the present invention. In this embodiment, a single electromagnetic wave absorbing inner member 158 having a smoothly saw-toothed top is formed on a bottom support member 152 between bottom portions 150b and 151b of two electromagnetic wave absorbing plates 150 and 151 so that the saw-toothed top directs to the top of the absorber. The inner member 158 is made of ohmic resistance loss material such as foamed (plastic) material containing carbon, graphite, or mixture of carbon and graphite as a separate component from or an integral component with the bottom support member 152. Constitution and function of the absorbers of this embodiment are substantially the same as those of the sixth embodiment shown in FIGS. 9 and 10 except for the above-mentioned shape of the wave absorbing inner member 158.

Figure 16:
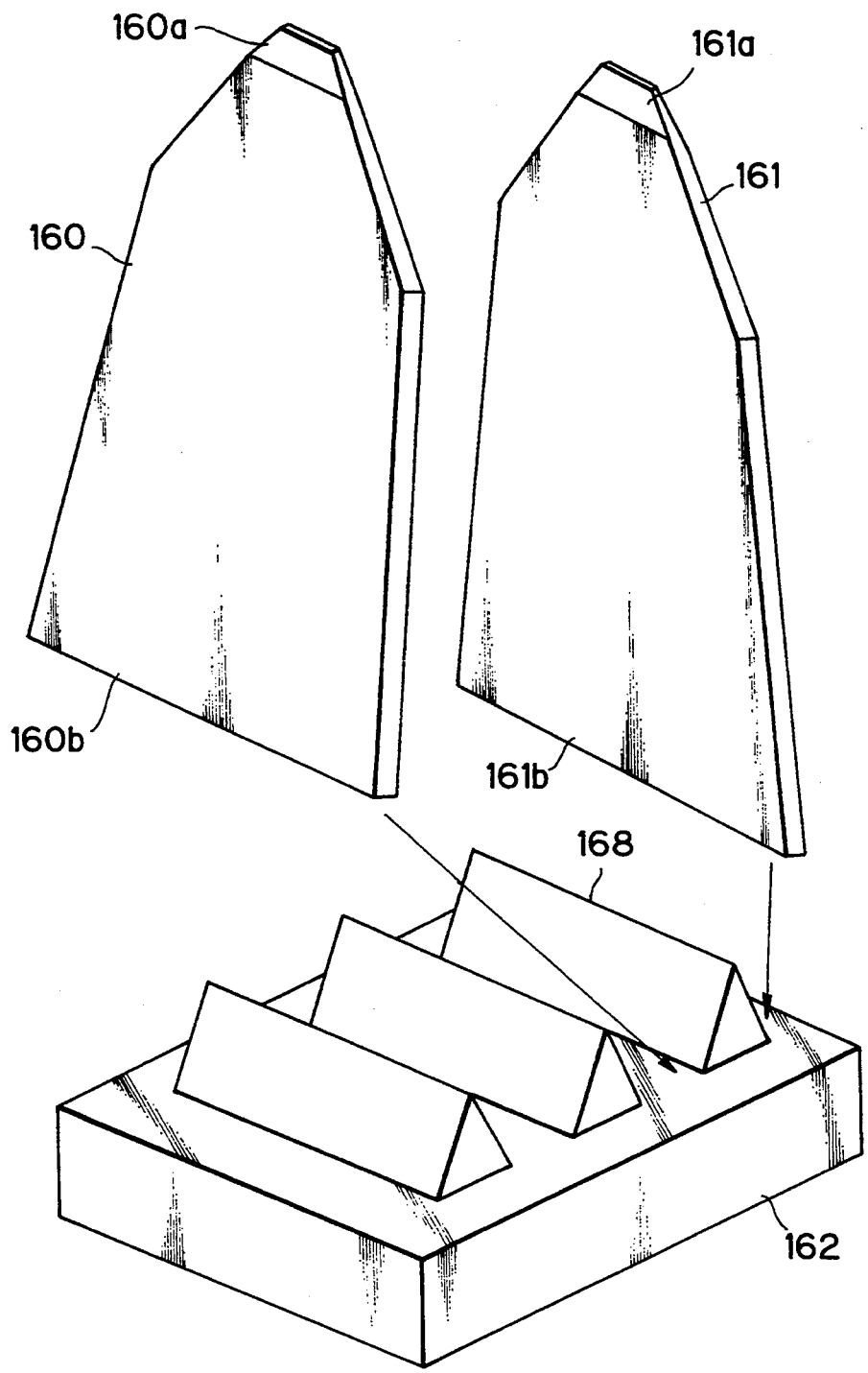
FIG. 16 shows an exploded perspective view of an electromagnetic wave absorber as a twelfth embodiment according to the present invention.

FIG. 16 shows an exploded perspective view of an electromagnetic wave absorber as a twelfth embodiment according to the present invention. In this embodiment, each of electromagnetic wave absorbing plates 160 and 161 is formed in modified hexagon shape as that the lateral width of the plate becomes narrower toward the top of the plate itself. This results that the weight of the absorbing plates 160 and 161 can be more decreased causing the transportation and the installation of the absorbers to the anechoic chamber to become easier. Furthermore, the plates 160 and 161 of this shape can effectively attenuate reflections of waves because the input impedance of the absorber against the incidence waves will gradually change. Particularly, this embodiment is advantageous for effectively suppressing the wave reflection in case the thickness of top portions of the wave absorbing plates cannot be formed thinner. Constitution and function of a bottom support member 162 and a single electromagnetic wave absorbing inner member 168 formed on the bottom support member 162 between bottom portions 160$b$ and 161$b$ of the wave absorbing plates 160 and 161 of this embodiment are substantially the same as those of the sixth embodiment shown in FIGS. 9 and 10 except for the above-mentioned shape of the wave absorbing plates 160 and 161.

The above-mentioned twelfth embodiment can be modified by forming each of electromagnetic wave absorbing plates in modified pentagon shape or arcked shape in which the lateral width of the plate becomes narrower toward the top of the plate itself, and/or by replacing the inner member 168 with another wave absorbing inner member having different shapes as shown in FIGS. 11 to 15.

Figure 17:
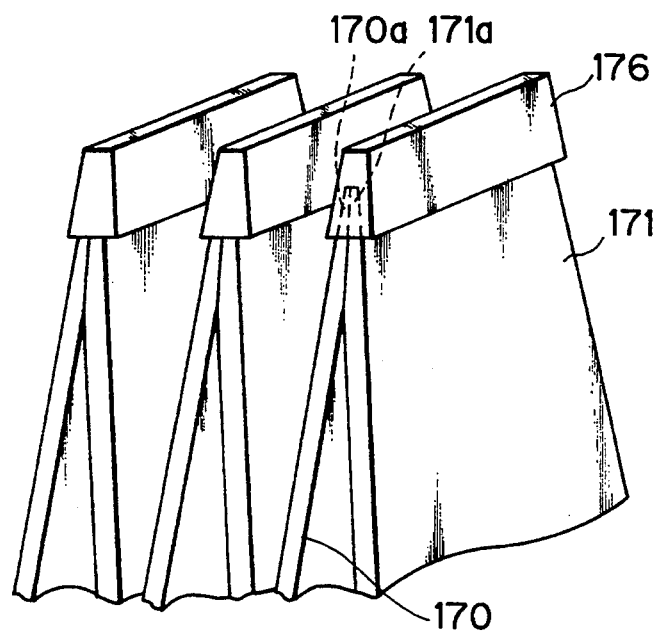
FIG. 17 shows a partial perspective view of a part of electromagnetic wave absorbers as a thirteenth embodiment according to the present invention.

FIG. 17 shows a partial perspective view of assembled electromagnetic wave absorbers as a thirteenth embodiment according to the present invention. In this embodiment, a separate top support member 176 having a single pit is assembled with the top of a pair of electromagnetic wave absorbing plates 170 and 171. Namely, top portions 170$a$ and 171$a$ of the wave absorbing plates 170 and 171 are abutted and fixed with each other, and this fixed top part is inserted into and fixed to the pit of the member 176 by an adhesive agent for example. Different pairs of the wave absorbing plates are engaged with different separate top support members, respectively. These top support members 176 are made of white foamed material which substantially passes electromagnetic wave without absorbing. By covering the top portions of the plates 170 and 171 with the support members 176, mechanical strength at these abutted parts will be increased and also the top parts of the absorbers will be protected from being damaged. Furthermore, since the top support members 176 are constituted by white material, the walls of the anechoic chamber will be more lightened. Constitution and function of the absorbers of this embodiment are substantially the same as those of the aforementioned embodiments except for additionally having the top support members 176.

Figure 18:
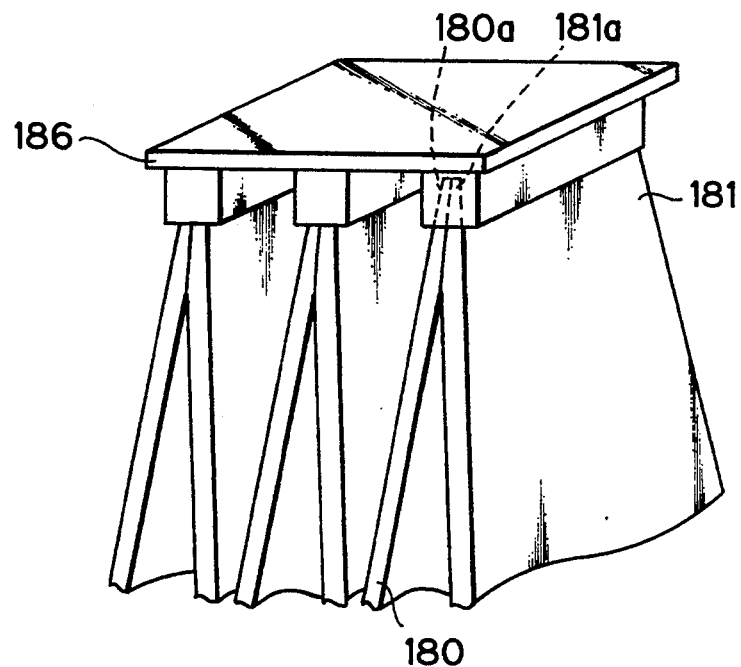
FIG. 18 shows a partial perspective view of a part of electromagnetic wave absorbers as a fourteenth embodiment according to the present invention.

FIG. 18 shows a partial perspective view of assembled electromagnetic wave absorbers as a fourteenth embodiment according to the present invention. In this embodiment, a single top support member 186 having a plurality of rectangular holes is assembled with the tops of a plurality of pairs of electromagnetic wave absorbing plates 180 and 181, respectively. Namely, top portions 180$a$ and 181$a$ of the wave absorbing plates 180 and 181 are abutted and fixed with each other, and this fixed top part is inserted into and fixed to one of the rectangular holes of the member 186 by an adhesive agent for example. The remaining pairs of the wave absorbing plates are engaged with the remaining rectangular holes of the top support member 186, respectively, so that the top parts off the plates are coupled with each other by means of this member 186. This top support members 186 is made of white foamed material which substantially passes electromagnetic wave without absorbing. By covering the top portions of the plates 180 and 181 with the support members 186, mechanical strength at these abutted parts will be increased and also the top parts of the absorbers will be protected from being damaged. Furthermore, since the top support member 186 has a rectangular wide top surface and is constituted by white material, the walls of the anechoic chamber will be more effectively lightened. Constitution and function of the absorbers of this embodiment are substantially the same as those of the aforementioned embodiments except for additionally having the single top support member 186.

Figure 19:
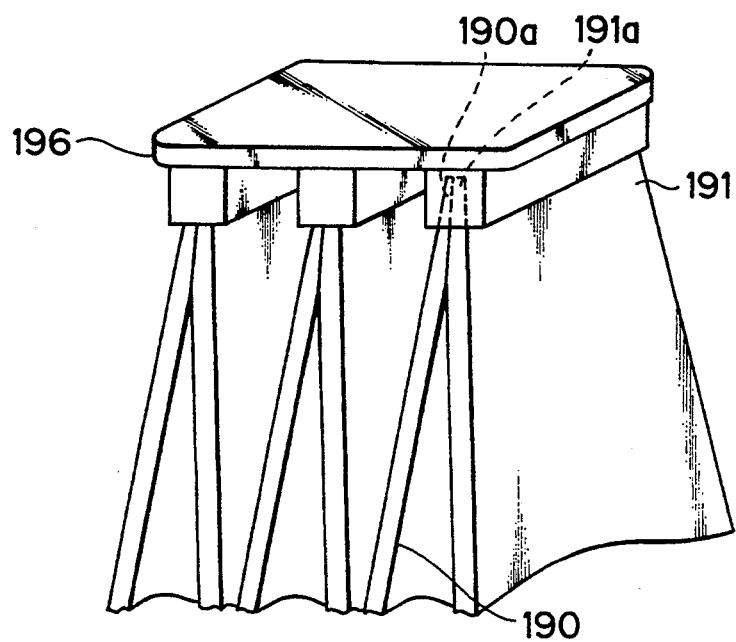
FIG. 19 shows a partial perspective view of a part of electromagnetic wave absorbers as a fifteenth embodiment according to the present invention.

FIG. 19 shows a partial perspective view of assembled electromagnetic wave absorbers as a fifteenth embodiment according to the present invention. In this embodiment, a single top support member 196 having a nearly rectangular wide top surface with rounded-corners and a plurality of rectangular holes at its bottom is assembled with the tops of a plurality of pairs of electromagnetic wave absorbing plates 190 and 191, respectively. Namely, top portions 190$a$ and 191$a$ of the wave absorbing plates 190 and 191 are abutted and fixed with each other, and this fixed top part is inserted into and fixed to one of the rectangular holes of the member 196 by an adhesive agent for example. The remaining pairs of the wave absorbing plates are engaged with the remaining rectangular holes of the top support member 196, respectively, so that the top parts of the plates are coupled with each other by means of this member 196. This top support member 196 is made of white foamed material which substantially passes electromagnetic wave without absorbing. By covering the top portions of the plates 190 and 191 with the support members 196, mechanical strength at these abutted parts will be increased and also the top parts of the absorbers will be protected from being damaged. Furthermore, since the member 196 has the chamfered wide top surface and is constituted by white material, the walls of the anechoic chamber will be more effectively lightened. Constitution and function of the absorbers of this embodiment are substantially the same as those of the aforementioned embodiments except for additionally having the single top support member 196.

The aforementioned thirteenth to fifteenth embodiments of FIGS. 17 to 19 can be modified by forming the top support member with a light color material without white, and/or by combining any of wave absorbing inner members having shapes as shown in FIGS. 9 to 15.

Figure 20:
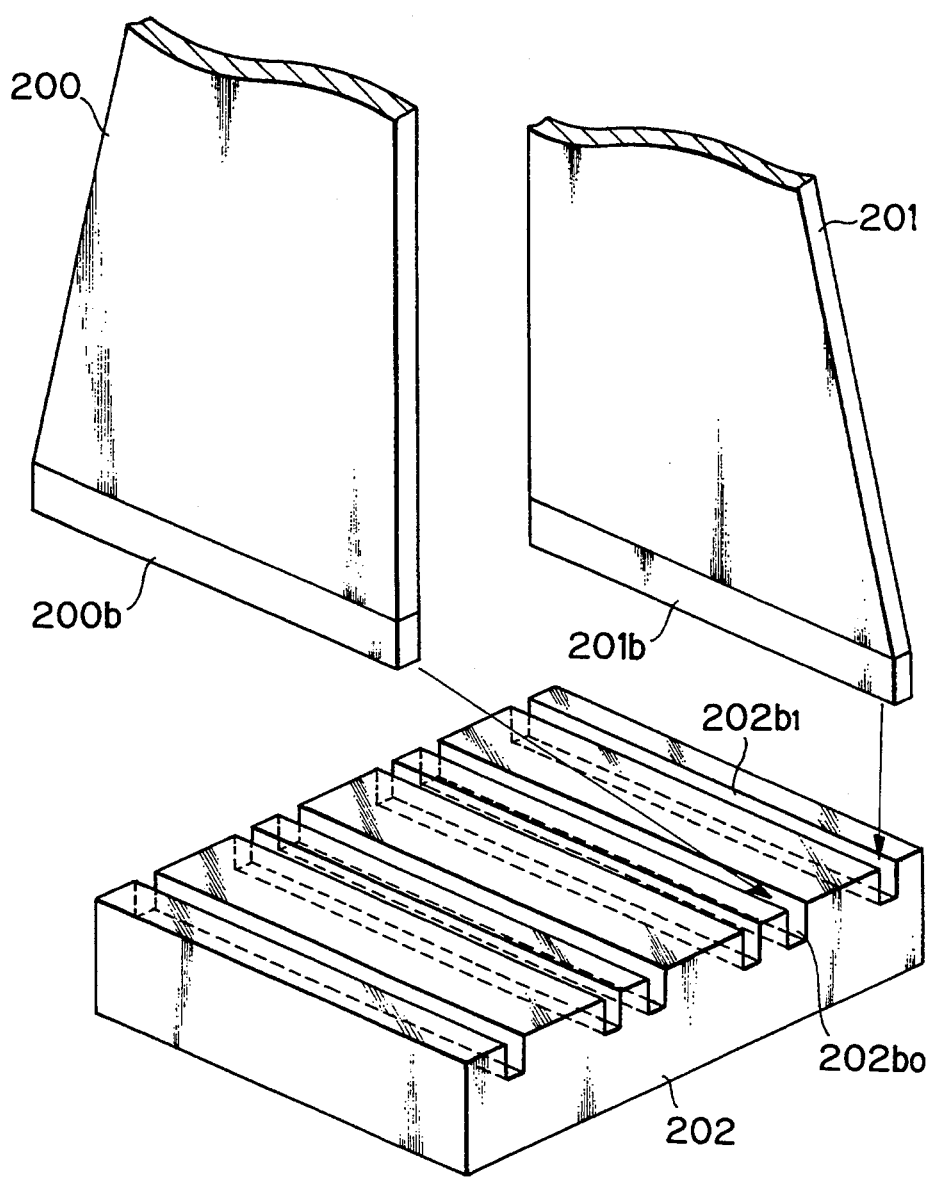
FIG. 20 shows a partial exploded perspective view of a part of an electromagnetic wave absorption structure as a sixteenth embodiment according to the present invention.

FIG. 20 shows a partial exploded perspective view of a part of an electromagnetic wave absorption structure as a sixteenth embodiment according to the present invention. In this embodiment, a bottom support member 202 having a plurality of aligned grooves 202$b$0 and-202$b$1 is assembled with the bottom parts of a plurality of pairs of electromagnetic wave absorbing plates 200 and 201, respectively. Namely, bottom portions 200$b$ and 201$b$ of the wave absorbing plates 200 and 201 are inserted into and fixed to the corresponding grooves 202$b$0 and 202$b$1 of the member 202 by an adhesive agent for example, respectively. The remaining pairs of the wave absorbing plates are engaged with the remaining grooves of the bottom support member 202, respectively. This bottom support member 202 is made of ohmic resistance loss material such as foamed (plastic) material containing carbon, graphite, or mixture of carbon and graphite. By using the grooves 202b0 and 202b1 for attaching the bottom portions of the plates 200 and 201 to the support members 202, more increased strength of the fixing can be expected. Constitution and function of the absorbers of this embodiment are substantially the same as those of the aforementioned embodiments except for the above-mentioned fixing structure of the plates 200 and 201 and the bottom support member 202.

Figure 21:
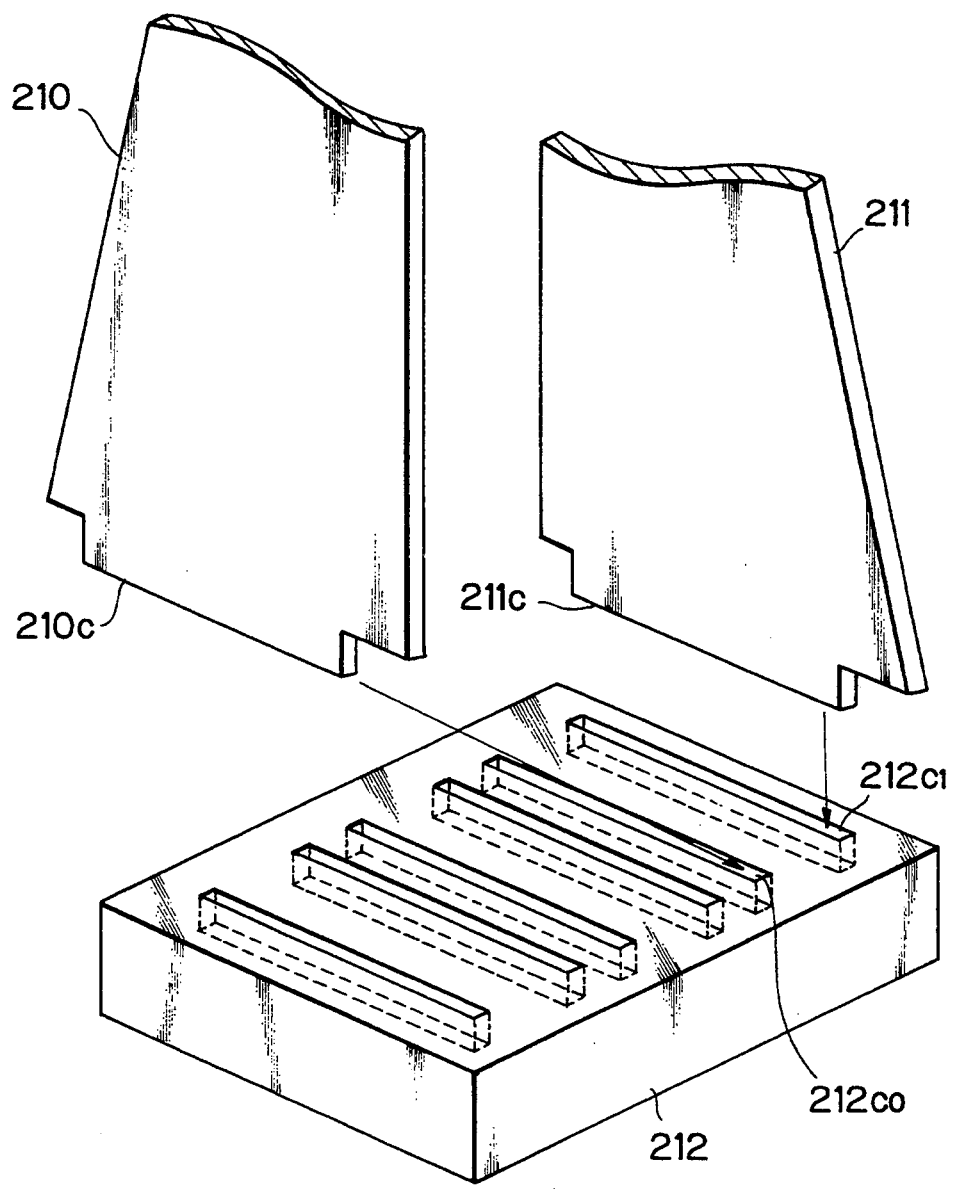
FIG. 21 shows a partial exploded perspective view of a part of an electromagnetic wave absorption structure as a seventeenth embodiment according to the present invention.

FIG. 21 shows a partial exploded perspective view of a part of an electromagnetic wave absorption structure as a seventeenth embodiment according to the present invention. In this embodiment, a bottom support member 212 having a plurality of aligned long rectangular holes (mortises) 212c0 and 212c1 assembled with the bottom parts of a plurality of pairs of electromagnetic wave absorbing plates 210 and 211, respectively. Namely, the wave absorbing plates 210 and 211 have respective legs (tenons) 210c and 211c at their bottom ends and these legs 210c and 211c are inserted into and fixed to the corresponding holes 212c0 and 212c1 of the member 212 by an adhesive agent for example, respectively. The remaining pairs of the wave absorbing plates are engaged with the remaining rectangular holes of the bottom support member 212, respectively. This bottom support member 212 is made of ohmic resistance loss material such as foamed (plastic) material containing carbon, graphite, or mixture of carbon and graphite. By using the rectangular holes 212c0 and 212c1 and the legs 210c and 211c (tenons and mortises) for attaching the plates 210 and 211 to the support members 212, lateral movement of the plates 210 and 211 can be suppressed resulting easier assembling. Also, extremely increased strength of the fixing can be expected. Constitution and function of the absorbers of this embodiment are substantially the same as those of the aforementioned embodiments except for the above-mentioned fixing structure of the plates 210 and 211 and the bottom support member 212.

Figure 22:
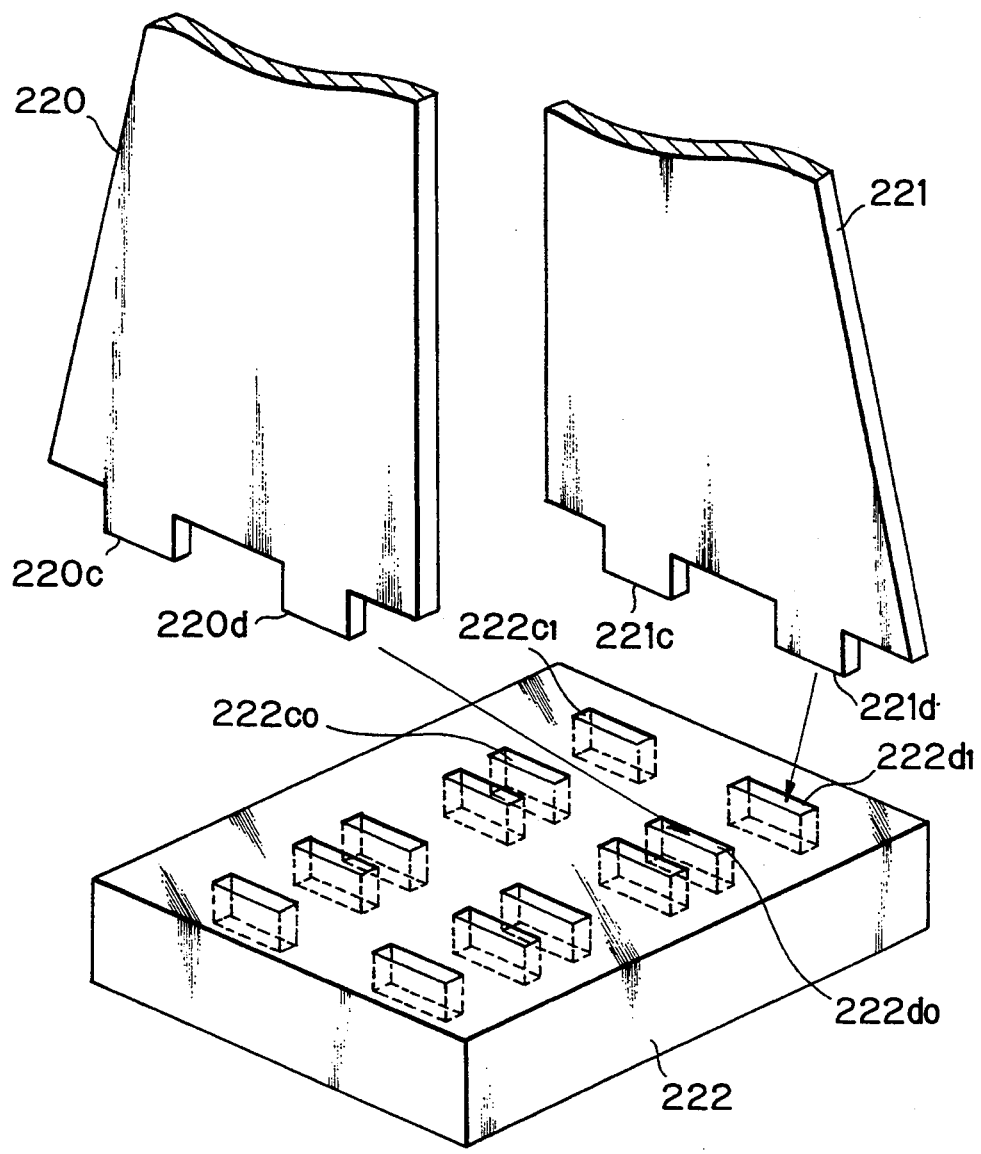
FIG. 22 shows a partial exploded perspective view of a part of an electromagnetic wave absorption structure as a eighteenth embodiment according to the present invention.

FIG. 22 shows a partial exploded perspective view of a part of an electromagnetic wave absorption structure as an eighteenth embodiment according to the present invention. In this embodiment, a bottom support member 222 having a plurality of rectangular holes (mortises) 222c0, 222c1, 222d0 and 222d1 arranged in two arrays is assembled with the bottom parts of a plurality of pairs of electromagnetic wave absorbing plates 220 and 221, respectively. Namely, the wave absorbing plates 220 and 221 have legs (tenons) 220c and 220d and legs (tenons) 221c and 221d at their bottom ends, respectively, and these legs 220c, 220d, 221c and 221d are inserted into and fixed to the corresponding holes 222c0, 222d0, 222c1 and 222d1 of the member 222 by an adhesive agent for example, respectively. The remaining pairs of the wave absorbing plates are engaged with the remaining rectangular holes of the bottom support member 222, respectively. This bottom support member 222 is made of ohmic resistance loss material such as foamed (plastic) material containing carbon, graphite, or mixture of carbon and graphite. By using the legs 220c, 220d, 221c and 221d and the rectangular holes 222c0, 222d0, 222c1 and 222d1 (tenons and mortises) for attaching the plates 220 and 221 to the support members 222, lateral movement of the plates 220 and 221 can be suppressed resulting easier assembling. Furthermore, since the number of the legs and holes is increased, extremely secure strength of the fixing can be expected. Constitution and function of the absorbers of this embodiment are substantially the same as those of the aforementioned embodiments except for the above-mentioned fixing structure of the plates 220 and 221 and the bottom support member 222.

Figure 23:
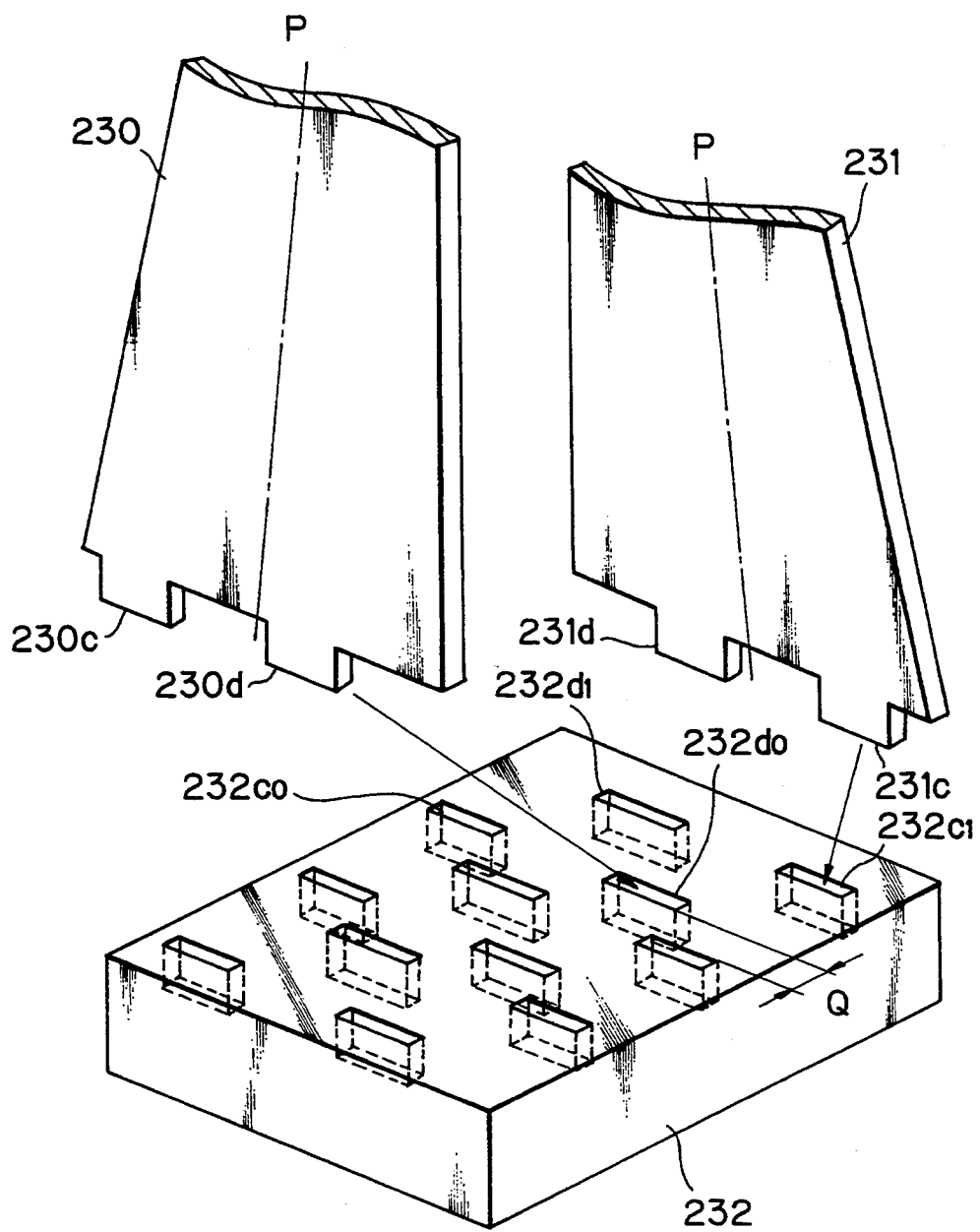
FIG. 23 shows a partial exploded perspective view of a part of an electromagnetic wave absorption structure as a nineteenth embodiment according to the present invention.
Figure 24:
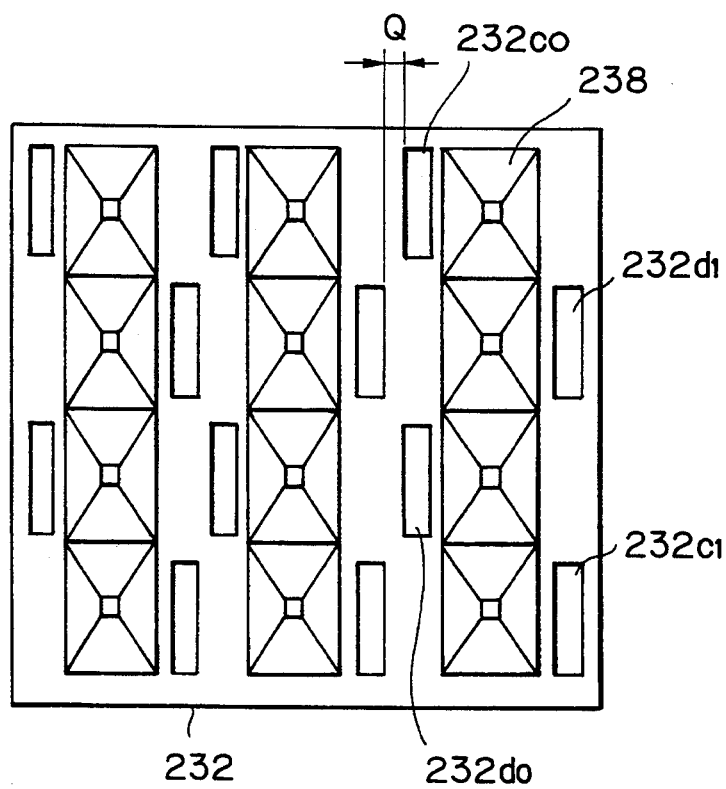
FIG. 24 shows a plane view of a bottom support member of the nineteenth embodiment shown in FIG. 23.

FIG. 23 shows a partial exploded perspective view of a part of an electromagnetic wave absorption structure as a nineteenth embodiment according to the present invention, and FIG. 24 shows a plane view of a bottom support member and wave absorbing inner members of the nineteenth embodiment. In this embodiment, a bottom support member 232 having a plurality of rectangular holes (mortises) 232c0, 232d1, 232d0 and 232c1 arranged in zigzag arrays is assembled with the bottom parts of a plurality of pairs of electromagnetic wave absorbing plates 230 and 231, respectively. Namely, the wave absorbing plates 230 and 231 have legs (tenons) 230c and 230d and legs (tenons) 231c and 231d at their bottom ends, respectively. These legs are formed at asymmetry positions with respect to center lines P of the plates 230 and 231 and these rectangular holes are arranged on the member 232 at positions corresponding to the deviated positions of the legs. It should be noted that the plates 230 and 231 have the same shape and thus the absorbers of this embodiment can be produced by using only one kind of wave absorbing plate. These legs 230c, 230d, 231d and 231c are inserted into and fixed to the corresponding rectangular holes 232c0, 232d0, 232d1 and 232c1 of the member 232 by an adhesive agent for example, respectively. The remaining pairs of the wave absorbing plates are engaged with the remaining rectangular holes of the bottom support member 232, respectively. This bottom support member 232 is made of ohmic resistance loss material such as foamed (plastic) material containing carbon, graphite, or mixture of carbon and graphite.

By using the legs 230c, 230d, 231d and 231c and the corresponding rectangular holes 232c0, 232d0, 232d1 and 232c1 (tenons and mortises) for attaching the plates 230 and 231 to the support members 232, lateral movement of the plates 230 and 231 can be suppressed resulting easier assembling. Furthermore, as seen from FIGS. 23 and 24, since the rectangular holes on the support member 232 are zigzag arranged, the distance Q between the adjacent holes can be shortened. The distance Q corresponds to a gap between the absorbers on the support member 232. Therefore, if this distance is shortened, the wave absorbing characteristics of the absorption structure will be improved.

As shown in FIG. 24, an array of electromagnetic wave absorbing inner members 238 having nearly pyramid shapes is formed between the holes 232d1 and 232c1 and the holes 232c0 and 232d0 on the support member 232. Constitution and function of the absorbers of this embodiment are substantially the same as those of the aforementioned embodiments except for the above-mentioned fixing structure of the plates 230 and 231 and the bottom support member 232.

The aforementioned sixteenth to nineteenth embodiments of FIGS. 20 to 24 can be modified by combining any of wave absorbing inner members having shapes as shown in FIGS. 9 to 15.

Figure 25:
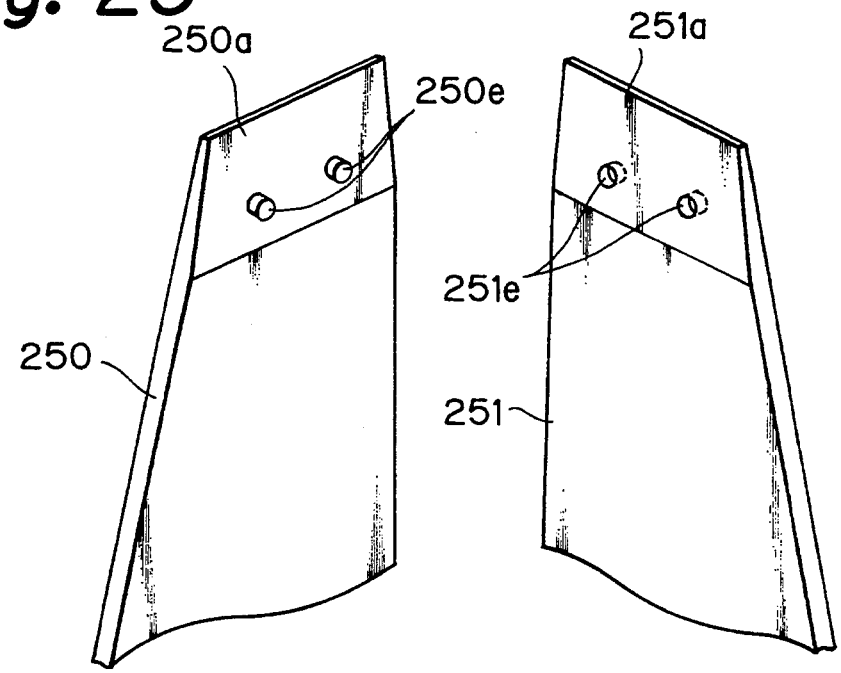
FIG. 25 shows a partial exploded perspective view of an electromagnetic wave absorber as a twentieth embodiment according to the present invention.

FIG. 25 shows a partial exploded perspective view of an electromagnetic wave absorber as a twentieth embodiment according to the present invention. In this embodiment, two projections 250e and two recesses 251e which can receive the respective projections 250e are formed at top portions 250a and 251a of electromagnetic wave absorbing plates 250 and 251, respectively. By providing such the projections and recesses, secure fixing of the plate 250 and 251 without movement can be expected. Furthermore, since in assembling the absorber, the plates 250 and 251 can be provisionally fixed by engaging the projections 250e into the recesses 251e before the top portions 250a and 251a are permanently fixed by an adhesive agent or by covering the top portions with a top support member, assembling operation will become easier. Constitution and function of the absorbers of this embodiment are substantially the same as those of the aforementioned embodiments except for the above-mentioned fixing structure of the plates 250 and 251.

Figure 26:
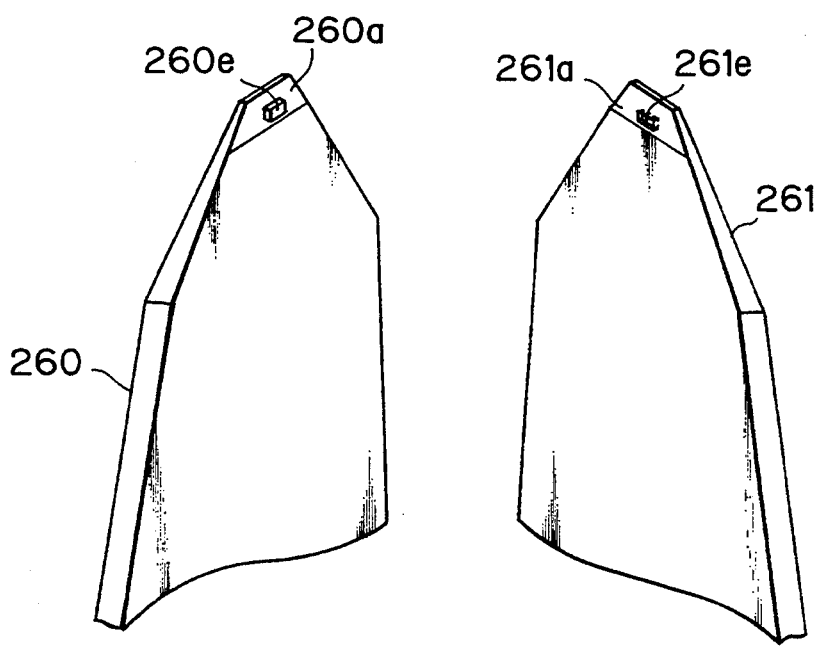
FIG. 26 shows a partial exploded perspective view of an electromagnetic wave absorber as a twenty-first embodiment according to the present invention.

FIG. 26 shows a partial exploded perspective view of an electromagnetic wave absorber as a twenty-first embodiment according to the present invention. In this embodiment, each of electromagnetic wave absorbing plates 260 and 261 is formed in modified hexagon shape as that the lateral width of the plate becomes narrower toward the top of the plate itself. Furthermore, a rectangular projection 260e and a rectangular recess 261e which can receive the projection 260e are formed at top portions 260a and 261a of the plates 260 and 261, respectively. By providing such the projection and recess, secure fixing of the plate 260 and 261 without movement can be expected. Furthermore, since in assembling the absorber, the plates 260 and 261 can be provisionally fixed by engaging the projection 260e into the recess 261e before the top portions 260a and 261a are permanently fixed by an adhesive agent or by covering the top portions with a top support member, assembling operation will become easier. Constitution and function of the absorbers of this embodiment are substantially the same as those of the aforementioned embodiments except for the above-mentioned shapes and the fixing structure of the plates 260 and 261.

Figure 27:
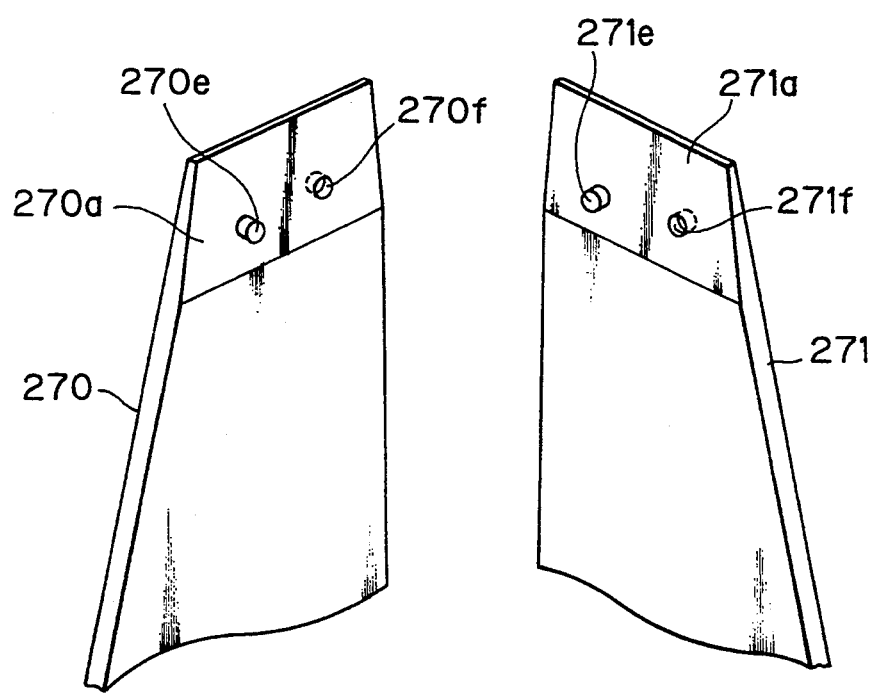
FIG. 27 shows a partial exploded perspective view of an electromagnetic wave absorber as a twenty-second embodiment according to the present invention.

FIG. 27 shows a partial exploded perspective view of an electromagnetic wave absorber as a twenty-second embodiment according to the present invention. In this embodiment, a set of a projection 270e and a recess 270f which can receive a corresponding projection 271e and a set of the projection 271e and a recess 271f which can receive the corresponding projection 270e are formed at top portions 270a and 271a of electromagnetic wave absorbing plates 270 and 271, respectively. It should be noted that the plates 270 and 271 have the same shape and thus the absorbers of this embodiment can be produced by using only one kind of wave absorbing plate.

By providing such the projections and recesses, more secure fixing of the plate 270 and 271 without movement can be expected. Furthermore, since in assembling the absorber, the plates 270 and 271 can be provisionally fixed by engaging the projections 270e and 271e into the recesses 271f and 270f, respectively, before the top portions 270a and 271a are permanently fixed by an adhesive agent or by covering The top portions with a top support member, assembling operation will become easier. Constitution and function of the absorbers of this embodiment are substantially the same as those of the aforementioned embodiments except for the above-mentioned fixing structure of the plates 270 and 271.

Figure 28A:
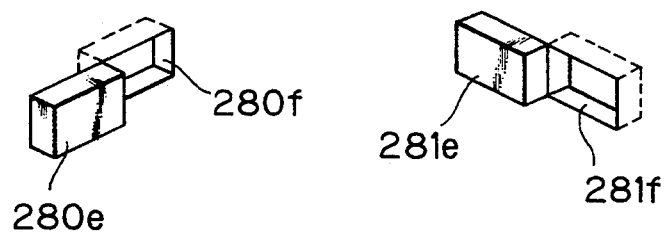
FIGS. 28a and 28b show a partial view and a partial exploded perspective view of an electromagnetic wave absorber as a twenty-third embodiment according to the present invention.
Figure 28B:
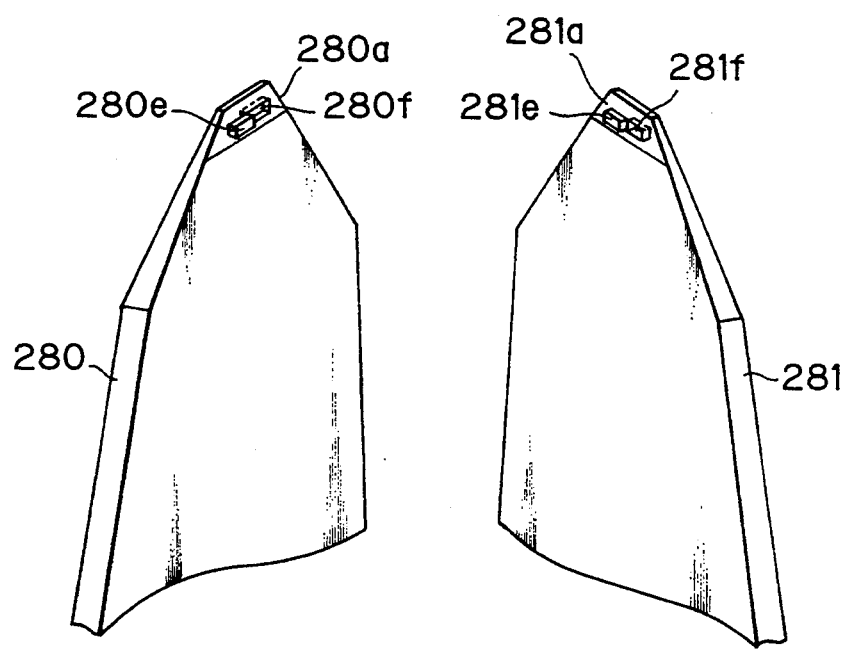

FIG. 28b shows a partial exploded perspective view of an electromagnetic wave absorber as a twenty-third embodiment according to the present invention, and FIG. 28a shows an enlarged view of projections and recesses shown in FIG. 28b. In this embodiment, each of electromagnetic wave absorbing plates 280 and 281 is formed in modified hexagon shape as that the lateral width of the plate becomes narrower toward the top of the plate itself. Furthermore, a set of a rectangular projection 280e and a rectangular recess 280f which can receive a corresponding rectangular projection 281e and a set of the rectangular projection 281e and a rectangular recess 281f which can receive the corresponding rectangular projection 280e are formed at top portions 280a and 281a of electromagnetic wave absorbing plates 280 and 281, respectively. It should be noted that the plates 280 and 281 have the same shape and thus the absorbers of this embodiment can be produced by using only one kind of wave absorbing plate.

By providing such the projections and the recesses, more secure fixing of the plate 280 and 281 without movement can be expected. Furthermore, since in assembling the absorber, the plates 280 and 281 can be provisionally fixed by engaging the projections 280e and 281e into the recesses 280f and 281f, respectively, before the top portions 280a and 281a are permanently fixed by an adhesive agent or by covering the top portions with a top support member, assembling operation will become easier. As the wave absorbing plates 280 and 281 are the same shape, the number of component for assembling the absorber can be reduced causing the cost of the absorption structure to be lowered. Constitution and function of the absorbers of this embodiment are substantially the same as those of the aforementioned embodiments except for the above-mentioned shapes and the fixing structure of the plates 280 and 281.

Figure 30:
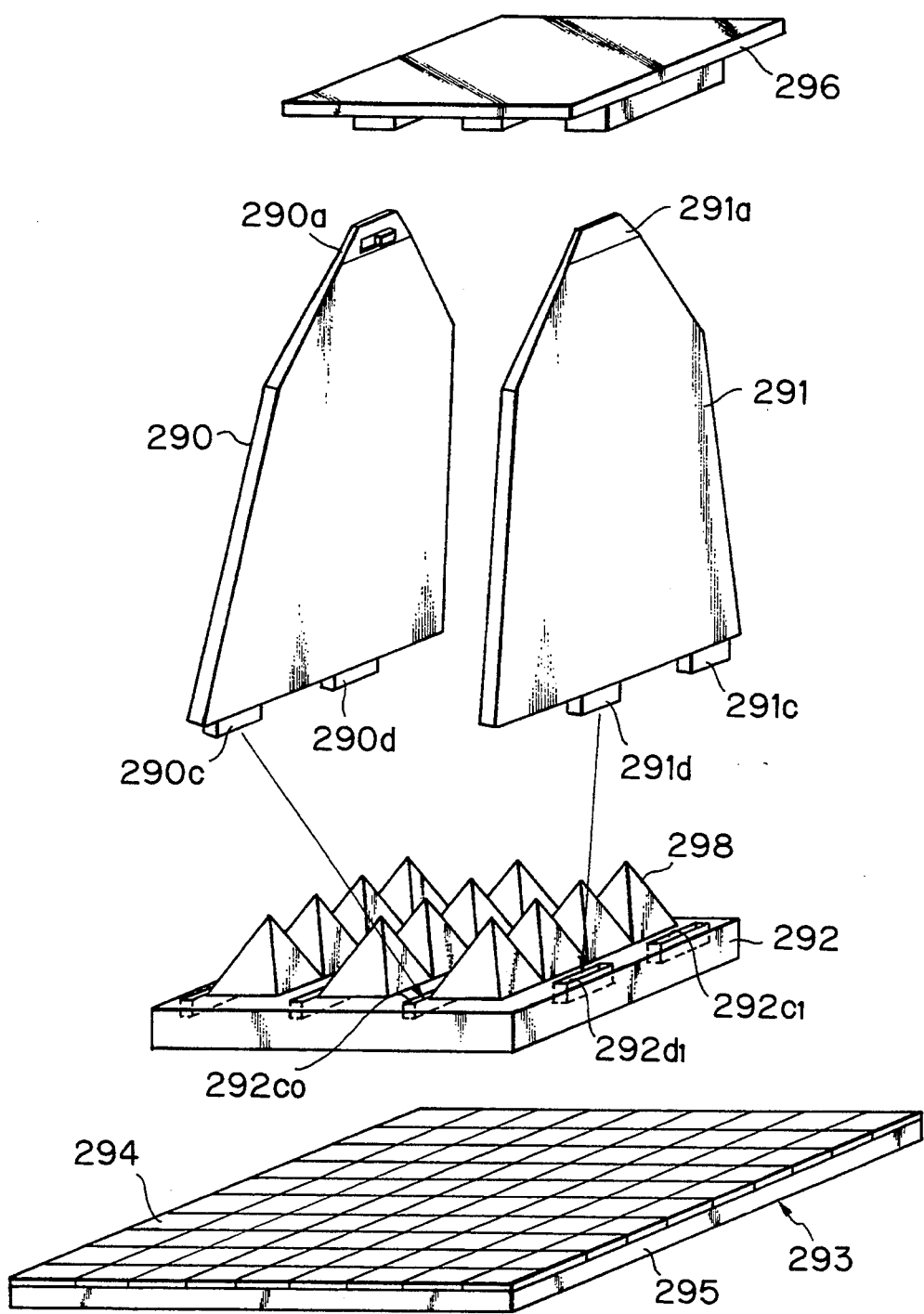
FIG. 30 shows an exploded perspective view of the twenty-fourth embodiment shown in FIG. 29.

FIG. 29 shows a perspective view of an electromagnetic wave absorption structure as a twenty-fourth embodiment according to the present invention, and FIG. 30 shows an exploded perspective view of FIG. 29. The wave absorption structure of this embodiment is constituted by combining the eighth (FIG. 12), twelfth (FIG. 16), fourteenth (FIG. 18), nineteenth (FIG. 23) and twenty-third (FIGS. 28a and 28b) embodiments.

Namely, each of electromagnetic wave absorbing plates 290 and 291 is formed in modified hexagon shape as that the lateral width of the plate becomes narrower toward the top of the plate itself. A set of a rectangular projection and a rectangular recess which can receive a corresponding rectangular projection are formed at each of top portions 290a and 291a of the wave absorbing plates 290 and 291, respectively. A bottom support member 292 has a plurality of rectangular holes (mortises) 292c0, 292d0 and 292c1 arranged in zigzag arrays. The plates 290 and 291 have legs (tenons) 290c and 290d and legs (tenons) 291c and 291d at their bottom ends, respectively. These legs are formed at asymmetry positions with respect to center lines of the respective plates 290 and 291.

In assembled state, these legs 290c, 291d and 291c are inserted into and fixed to the corresponding rectangular holes 292c0, 292d1 and 292c1 of the member 292 by an adhesive agent for example, respectively. The remaining pairs of the wave absorbing plates are engaged with the remaining rectangular holes of the bottom support member 292, respectively. An array of electromagnetic wave absorbing inner members 298 having nearly pyramid shapes is formed between the holes 292c0 and 292d1 on the support member 292. The top portions 290a and 291a of the plates 290 and 291 are abutted and fixed with each other, and this fixed top part is fixed into one of rectangular holes of a top support member 296 by an adhesive agent. The remaining pairs of the wave absorbing plates are engaged with the remaining rectangular holes of the top support member 296, respectively, so that the top parts of the plates are coupled with each other by means of this member 296. Each of electromagnetic wave absorbers is basically formed by the plates 290 and 291, the inner member 298 and the common bottom support member 292. These absorbers are arrayed on and fixed to, by an adhesive agent for example, ferrite wall member 293 which is constituted by a number of ferrite tiles 294, having the thickness of about 5 mm, stuck to all over the surface of a wall board 295 of an anechoic chamber. Constitution and function of the absorption structure and of the absorbers of this embodiment are substantially the same as those of the aforementioned embodiments.

Many widely different embodiments of the present invention may be constructed without departing from the spirit and scope of the present invention. It should be understood that the present invention is not limited to the specific embodiments described in the specification, except as defined in the appended claims.

What is claimed is:

1. An electromagnetic wave absorber comprising:
   a pair of electromagnetic wave absorbing plates made of ohmic resistance loss material, each of which has a top portion and a bottom portion;
   a top support member for supporting the top portions of said plates; and
   a common bottom support member for supporting the bottom portions of said plates,
   whereby, in an assembled state, the top portions of said plates are fixed with each other and the bottom portions of said plates are fixed by said bottom support member so that said plates form a wedge shape.

2. An absorber as claimed in claim 1, wherein each of said plates is constituted by a plate having a nearly rectangular shape.

3. An absorber as claimed in claim 1, wherein each of said plates is constituted by a plate having a lateral width being narrower toward its top.

4. An absorber as claimed in claim 1, wherein both said top support member and said bottom support member are made of wave passing material which substantially allows electromagnetic waves to pass therethrough without absorbing.

5. An absorber as claimed in claim 1, wherein both said top support member and said bottom support member are made of ohmic resistance loss material.

6. An absorber as claimed in claim 1, wherein said top support member is made of wave passing material which substantially allows electromagnetic waves to pass therethrough without absorbing, and said bottom support member is made of ohmic resistance loss material.

7. An absorber as claimed in claim 1, wherein said top support member is made of both wave passing material, which substantially allows electromagnetic waves to pass therethrough without absorbing, and ohmic resistance loss material.

8. An absorber as claimed in claim 1, wherein said absorber includes at least one electromagnetic wave absorbing inner member made of ohmic resistance loss material, said inner member being mounted on said bottom support member between said plates.

9. An absorber as claimed in claim 8, wherein said inner member is constituted by at least one electromagnetic wave absorbing inner plate to be directed perpendicular to said wave absorbing plates.

10. An absorber as claimed in claim 8, wherein said inner member is constituted by at least one inner member having a sharp tip to be directed to the top of said absorber.

11. An absorber as claimed in claim 10, wherein said bottom support member is made of ohmic resistance loss material formed integral with said inner member.

12. An absorber as claimed in claim 10, wherein said inner member is constituted by a block having a triangular prism shape.

13. An absorber as claimed in claim 10, wherein said inner member is constituted by a block having a pyramid shape.

14. An absorber as claimed in claim 10, wherein said inner member is constituted by a plurality of blocks having pyramid shapes arranged in an array.

15. An absorber as claimed in claim 10, wherein said inner member is constituted by a plurality of blocks having pyramid shapes arranged in two arrays.

16. An absorber as claimed in claim 10, wherein said inner member is constituted by a plurality of blocks having circular cone shapes arranged in an array.

17. An absorber as claimed in claim 10, wherein said inner member is constituted by a block having a smoothly saw-toothed top.

18. An absorber as claimed in claim 1, wherein said top support member is constituted by a support member for coupling the top portions of a plurality of pairs of said plates.

19. An electromagnetic wave absorber comprising:
    a pair of electromagnetic wave absorbing plates made of ohmic resistance loss material, each of which has a top portion and a bottom portion; and
    a common bottom support member for supporting the bottom portions of said plates, said bottom support member having a plurality of grooves for receiving the bottom portions of said plates,
    whereby, in an assembled state, the top portions of said plates are fixed with each other and the bottom portions of said plates are fixed by said bottom support member so that said plates form a wedge shape.

20. An electromagnetic wave absorber comprising:
    a pair of electromagnetic wave absorbing plates made of ohmic resistance loss material, each of which has a top portion, a bottom portion and at least one leg; and
    a common bottom support member for supporting the bottom portions of said plates, said bottom support member having a plurality of rectangular holes for receiving said legs of the plates, respectively,
    whereby, in an assembled state, the top portions of said plates are fixed with each other and the bottom portions of said plates are fixed by said bottom support member so that said plates form a wedge shape.

21. An absorber as claimed in claim 20, wherein said rectangular holes are zigzag arranged to receive said legs formed on each of said plates in asymmetrical arrangement.

22. An electromagnetic wave absorber comprising:
    a pair of electromagnetic wave absorbing plates made of ohmic resistance loss material, each of which has a top portion and a bottom portion, one of a pair of said plates having at least one projection and the other of a pair of said plates having at least one recess for receiving said projection; and a common bottom support member for supporting the bottom portions of said plates, whereby, in an assembled state, the top portions of said plates are fixed with each other and the bottom portions of said plates are fixed by said bottom support member so that said plates form a wedge shape.

23. An electromagnetic wave absorption structure comprising:

a plurality of electromagnetic wave absorbers each of which includes a pair of electromagnetic wave absorbing plates made of ohmic resistance loss material with top portions and bottom portions, a common bottom support member for supporting the bottom portions of said plates, and at least one electromagnetic wave absorbing inner member made of ohmic resistance loss material, said inner member being mounted on said bottom support member between said plates, whereby, in an assembled state, the top portions of said plates are fixed with each other and the bottom portions of said plates are fixed by said bottom support member so that said plates form a wedge shape; and a ferrite wall member, having a front surface, for covering walls of an anechoic chamber, said absorber being attached to the front surface of said ferrite wall member.

24. A wave absorption structure as claimed in claim 23, wherein said absorbers are arranged on said ferrite wall member so that each absorber is perpendicular to an adjacent absorber.

25. A wave absorption structure as claimed in claim 23, wherein three of said absorbers are arranged on said ferrite wall member to form a unit, each unit is perpendicular to an adjacent unit.

* * * * *